United States Patent
Jung et al.

(10) Patent No.: US 11,528,783 B2
(45) Date of Patent: Dec. 13, 2022

(54) INDUCTION HEATING DEVICE HAVING IMPROVED OUTPUT CONTROL FUNCTION

(71) Applicant: LG Electronics Inc., Seoul (KR)

(72) Inventors: Kyung Hoon Jung, Seoul (KR); Dooyong Oh, Seoul (KR); Byeong Wook Park, Seoul (KR)

(73) Assignee: LG Electronics Inc., Seoul (KR)

( * ) Notice: Subject to any disclaimer, the term of this patent is extended or adjusted under 35 U.S.C. 154(b) by 133 days.

(21) Appl. No.: 17/018,842

(22) Filed: Sep. 11, 2020

(65) Prior Publication Data

US 2021/0084722 A1 Mar. 18, 2021

(30) Foreign Application Priority Data

Sep. 17, 2019 (KR) .................... 10-2019-0113977

(51) Int. Cl.
*H05B 6/08* (2006.01)
*F24C 7/08* (2006.01)
(Continued)

(52) U.S. Cl.
CPC .............. *H05B 6/08* (2013.01); *F24C 7/086* (2013.01); *G01R 25/005* (2013.01); *G01R 25/04* (2013.01); *H05B 6/04* (2013.01); *H05B 6/062* (2013.01)

(58) Field of Classification Search
CPC ....... G01R 25/005; G01R 25/04; F24C 7/086; H05B 6/08; H05B 6/062; H05B 6/04
See application file for complete search history.

(56) References Cited

U.S. PATENT DOCUMENTS

| 5,248,866 A | * | 9/1993 | Tanaka | .................... H05B 6/062 363/97 |
| 5,536,920 A | * | 7/1996 | Kwon | ...................... H05B 6/04 219/625 |

(Continued)

FOREIGN PATENT DOCUMENTS

| EP | 0405611 | | 7/1990 |
| JP | 2007-080752 A | * | 3/2007 |

(Continued)

OTHER PUBLICATIONS

Extended European Search Report in EP Appln. No. 20189663.6, dated Jan. 22, 2021, 6 pages.

(Continued)

*Primary Examiner* — Thien S Tran
(74) *Attorney, Agent, or Firm* — Fish & Richardson P.C.

(57) ABSTRACT

An induction heating device includes a working coil, an inverter including a first switching element and a second switching element that are configured to perform a switching operation and to apply a resonance current to the working coil, a snubber capacitor including a first snubber capacitor connected to the first switching element, and a second snubber capacitor connected to the second switching element, a phase detector configured to detect a phase difference between the resonance current applied to the working coil and a switching voltage applied to the second switching element, and a controller configured to receive, from the phase detector, phase information including the phase difference, provide the inverter with a switching signal to thereby control the switching operation, and adjust an operating frequency of the switching signal based on the phase information to thereby control an output of the working coil.

20 Claims, 23 Drawing Sheets

(51) Int. Cl.
*G01R 25/00* (2006.01)
*G01R 25/04* (2006.01)
*H05B 6/04* (2006.01)
*H05B 6/06* (2006.01)

(56) References Cited

U.S. PATENT DOCUMENTS

| | | | | |
|---|---|---|---|---|
| 5,571,438 | A * | 11/1996 | Izaki | H02M 7/538 |
| | | | | 219/625 |
| 5,648,008 | A * | 7/1997 | Barritt | H05B 6/062 |
| | | | | 219/661 |
| 9,844,099 | B2 * | 12/2017 | Yun | H05B 6/04 |
| 2011/0019452 | A1 * | 1/2011 | Shinomoto | H02M 7/217 |
| | | | | 363/126 |
| 2013/0194851 | A1 * | 8/2013 | Shan | H02M 7/53871 |
| | | | | 363/131 |
| 2015/0201467 | A1 | 7/2015 | Yun et al. | |
| 2015/0250027 | A1 * | 9/2015 | Takano | H05B 6/062 |
| | | | | 219/664 |
| 2018/0063897 | A1 * | 3/2018 | Park | H05B 6/065 |

FOREIGN PATENT DOCUMENTS

| | | |
|---|---|---|
| JP | 2007080752 | 3/2007 |
| JP | 2008021469 | 1/2008 |
| JP | 2014056684 | 3/2014 |

OTHER PUBLICATIONS

Acero et al. "Power measuring in two-output resonant inverters for induction cooking appliances," IEEE Power Electronics Specialists Conference (Cat. No. 02CH37289), Cairns, Qld., Australia, Jun. 23-27, 2002, 6 pages.

* cited by examiner

INDUCTION HEATING DEVICE HAVING IMPROVED OUTPUT CONTROL FUNCTION

CROSS-REFERENCE TO RELATED APPLICATION

This application claims priority to and the benefit of Korean Patent Application No. 10-2019-0113977, filed on Sep. 17, 2019, the disclosure of which is incorporated herein by reference in its entirety.

TECHNICAL FIELD

The present disclosure relates to an induction heating device with an improved output control function.

BACKGROUND

Various types of cooking utensils may be used to heat food in homes and restaurants. For example, gas ranges may use gas as fuel. In some cases, cooking devices may use electricity instead of gas to heat an object such as a vessel (or a cooking vessel) or a pot, for example.

A method of heating an object via electricity may be classified into a resistive heating method and an induction heating method. In the electrical resistive method, heat may be generated based on current flowing through a metal resistance wire or a non-metallic heating element, such as silicon carbide, and may be transmitted to the object through radiation or conduction, to heat the object. In the induction heating method, eddy current may be generated in the object (e.g., the cooking vessel) made of metal based on a magnetic field generated, around the coil, when a high-frequency power of a predetermined magnitude is applied to the coil to heat the object.

Induction heating devices may use an induction heating method and include a working coil disposed at multiple regions of the heating devices and configured to heat a plurality of objects (e.g., cooking vessels).

FIG. 1 shows an example of an induction heating device in related art. An output measuring method of the induction heating device in related art is described below with reference to FIG. 1.

Referring to FIG. 1, the induction heating device in related art may calculate an output value used for load (e.g., a cooking vessel) based on a magnitude of resonance current i1, a magnitude of resonance voltage v1, and a phase difference between the resonance current i1 and the resonance voltage v1.

SUMMARY

The present disclosure describes an induction heating device capable of improving an output control function and preventing or reducing generation of discharge loss of a snubber capacitor.

The objects of the present disclosure are not limited to the above-mentioned objects, and other objects and advantages of the present disclosure which are not mentioned can be understood by the following description and more clearly understood by the implementations of the present disclosure. It will also be readily apparent that the objects and advantages of the disclosure may be implemented by features described in claims and a combination thereof.

According to one aspect of the subject matter described in this application, an induction heating device includes a working coil, an inverter including a first switching element and a second switching element that are configured to perform a switching operation and to apply a resonance current to the working coil based on the switching operation, and a snubber capacitor including a first snubber capacitor electrically connected to the first switching element, and a second snubber capacitor electrically connected to the second switching element. The induction heating device further includes a phase detector electrically that is connected between the inverter and the working coil and configured to detect a phase difference between the resonance current applied to the working coil and a switching voltage applied to the second switching element, and a controller that is configured to receive, from the phase detector, phase information including the phase difference, provide the inverter with a switching signal to thereby control the switching operation, and adjust an operating frequency of the switching signal based on the phase information to thereby control an output of the working coil.

Implementations according to this aspect may include one or more of the following features. For example, the controller may be configured to detect a magnitude of the resonance current and a magnitude of the switching voltage through the phase detector, and determine the output of the working coil based on the magnitude of the resonance current, the magnitude of the switching voltage, and the phase information.

In some implementations, the induction heating device may further include an input interface configured to receive touch input from a user and transmit the touch input to the controller. The controller may be configured to, based on the touch input indicating an output command value for the working coil, determine an output value of the working coil, compare the output command value with the output value of the working coil, and adjust the operating frequency of the switching signal based the comparison of the output command value with the output value of the working coil. In some examples, the controller may be configured to, based on the output command value being equal to the output value of the working coil, maintain the operating frequency of the switching signal.

In some implementations, the controller may be configured to, based on the output command value being greater than the output value of the working coil, compare the phase difference with a preset phase value and adjust the operating frequency of the switching signal based on the comparison of the phase difference with the preset phase value. In some examples, the controller may be configured to, based on the phase difference being greater than or equal to the preset phase value, decrease the operating frequency of the switching signal, and based on the phase difference being less than the preset phase value, increase the operating frequency of the switching signal.

In some examples, the first snubber capacitor may be configured to, based on the phase difference being greater than or equal to the preset phase value, be completely discharged before the first switching element is turned on after the second switching element has been turned off. In some implementations, the controller may be configured to, based on the output command value being less than the output value of the working coil, increase the operating frequency of the switching signal.

In some implementations, the phase detector may include a current transformer that includes a first coil connected to the inverter and the working coil and configured to change a magnitude of a first resonance current in the first coil. The phase detector may further include a current detecting circuit electrically connected to the current transformer and configured to receive the first resonance current and to output a first voltage based on the first resonance current, a voltage detecting circuit electrically connected to the inverter and configured to receive the switching voltage applied to the second switching element and to output a second voltage based on the switching voltage, and an output circuit configured to receive the first voltage and the second voltage and to output a pulse based on the first voltage and second voltage.

In some examples, the controller may be configured to receive the pulse from the output circuit, and a pulse width of the pulse provided by the output circuit may correspond to the phase information. In some examples, the current detecting circuit may include a first current detecting resistor electrically connected to a second coil of the current transformer, a diode electrically connected to the first current detecting resistor, a second current detecting resistor electrically connected to the diode in series, a third current detecting resistor having a first end electrically connected to the second current detecting resistor and a second end connected to a ground, and a first comparator connected to a first node between the second current detecting resistor and the third current detecting resistor. The first comparator may be configured to output the first voltage.

In some implementations, the current detecting circuit may further include a hysteresis circuit electrically connected between the first node and an output terminal of the first comparator. The hysteresis circuit may include a first hysteresis resistor electrically connected between the first node and a positive input terminal of the first comparator, and a second hysteresis resistor having a first end electrically connected to the first hysteresis resistor and the positive input terminal, and a second end electrically connected to the output terminal of the first comparator.

In some implementations, the controller may be electrically connected to the first node and configured to detect a magnitude of a voltage applied to the first node and to determine a magnitude of the resonance current applied to the working coil based on the magnitude of the voltage applied to the first node.

In some implementations, the voltage detecting circuit may include a first voltage sensing resistor electrically connected to the second switching element, a second voltage sensing resistor having a first end electrically connected to the first voltage sensing resistor and a second end electrically connected to the ground, and a second comparator connected to a second node between the first voltage sensing resistor and the second voltage sensing resistor. The second comparator may be configured to output the second voltage. In some examples, the controller may be electrically connected to the second node and configured to detect a magnitude of a voltage applied to the second node and to determine a magnitude of the switching voltage applied to the second switching element based on the magnitude of the voltage applied to the second node.

In some implementations, the output circuit may include a first pulse generation resistor electrically connected to an output terminal of the current detecting circuit, a second pulse generation resistor electrically connected to an output terminal of the voltage detecting circuit, a third pulse generation resistor electrically connected to the second pulse generation resistor and the ground, where a third node is disposed between the second pulse generation resistor and the third pulse generation resistor, and a third comparator electrically connected to a fourth node disposed between the third node and the first pulse generation resistor. The third comparator may be configured to output the pulse.

In some examples, each of the first comparator, the second comparator, and the third comparator may include a complementary metal-oxide semiconductor (CMOS). In some examples, the first comparator may include a first reference terminal electrically connected to the ground, and the second comparator may include a second reference terminal electrically connected between the second end of the second voltage sensing resistor and the ground. The third comparator may include a third reference terminal electrically connected to the ground.

In some implementations, the first comparator may include a first output terminal corresponding to the output terminal of the current detecting circuit, and the second comparator may include a second output terminal corresponding to the output terminal of the voltage detecting circuit. The third comparator may include a third output terminal electrically connected to the controller. In some examples, the first output terminal may be connected to a positive input terminal of the first comparator that is connected to the first node.

In some implementations, the induction heating device may improve the output control function to prevent or reduce the discharge loss of the snubber capacitor from being generated.

In some implementations, the induction heating device may prevent or reduce heat generation and damage caused by hard switching of the inverter in advance. In some examples, products may be operated in a safe zone, minimizing heat generation and damage, to thereby improve product performance and reliability.

A specific effect, in addition to the above-mentioned effects, of the present disclosure will be described together while describing a detailed description to implement the present disclosure.

DETAILED DESCRIPTION

Figure 1:
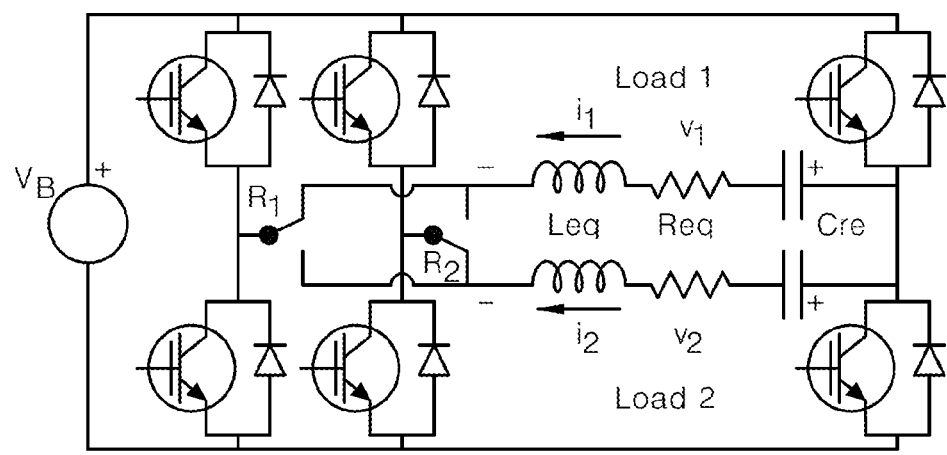
FIG. 1 shows an example of an induction heating device in related art.

One or more examples of the present disclosure will be described in detail with reference to the accompanying drawings. The same reference numeral is used to indicate the same or similar component in the figures.

An induction heating method is described below with reference to FIGS. 2 to 7.

Figure 2:
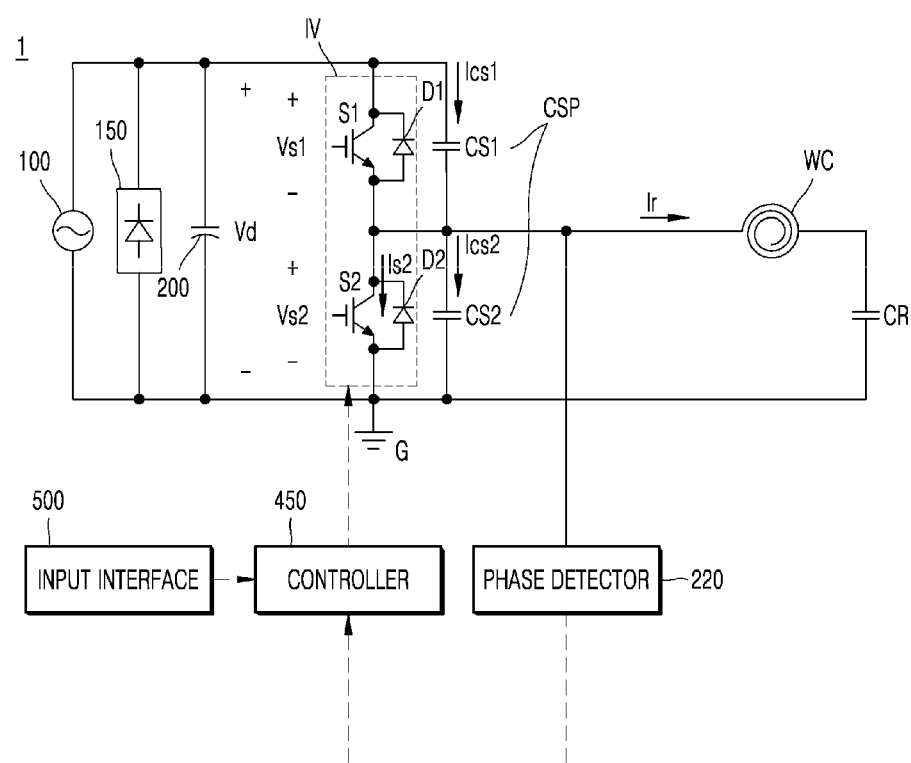
FIG. 2 is a circuit diagram showing an example induction heating device.

FIG. 2 is a circuit diagram showing an example induction heating device. FIGS. 3 to 7 show examples of power loss caused by switching operation of the inverter shown in FIG. 2.

In some implementations, referring to FIGS. 2 to 7, an induction heating device 1 includes a power supply 100, a rectifier 150, a direct current (DC) link capacitor 200, an inverter IV, and a snubber capacitor CSP, a working coil WC, a resonance capacitor CR, a phase detector 220, a controller 450, and an input interface 500.

The power supply 100 may output an alternating current (AC).

In some examples, the power supply 100 may output the AC and provide the rectifier 150 with the AC. For example, the power supply 100 may be a commercial power supply.

The rectifier 150 may convert the AC current supplied by the power supply 100 into a DC current and may supply the DC current to the inverter IV.

In some examples, the rectifier 150 may rectify and convert, into a DC current, the AC current supplied from the power supply 100, and may provide the DC link capacitor 200 with the converted DC current.

The DC link capacitor 200 may reduce ripple or variation of the DC current provided by the rectifier 150 to provide the inverter IV with the ripple of the DC.

In some examples, the DC link capacitor 200 may reduce the ripple of the DC provided by the rectifier 150 and may provide the inverter IV with the DC having the reduced ripple.

In some examples, the DC link capacitor 200 may include, for example, a smoothing capacitor.

The DC rectified by the rectifier 150 and the DC link capacitor 200 may be supplied to the inverter IV.

In some examples, DC voltage Vd is applied to the DC link capacitor 200 based on the DC provided by the rectifier 150, and the ripple of the DC voltage Vd is reduced in the DC link capacitor 200 to supply the DC voltage Vd having the reduced ripple to the inverter IV.

The inverter IV may be connected to a resonance circuit (e.g., a circuit region including the working coil WC and the resonance capacitor CR) and may apply a resonance current to the working coil WC through the switching operation.

In some examples, the inverter IV may include, for example, a half-bridge inverter IV, and the switching operation of the inverter IV may be controlled by the controller 450 described below. For example, the inverter IV may perform switching operation based on a switching signal (i.e., a control signal and also referred to as "a gate signal") received from the controller 450. In some cases, a half-bridge type inverter may include two switching elements and two capacitors, while a full-bridge type inverter may include four switching elements.

In some examples, the inverter IV may include a first switching element S1 and a second switching element S2 that perform switching operation, and the two switching elements S1 and S2 may be turned on and turned off based on the switching signal received from the controller 450. In some examples, the switching elements S1 and S2 may include an electric circuit, a transistor, metal oxide semiconductor field effect transistor (MOSFET), insulated-gate bipolar transistor (IGBT), a diode, or the like.

In some examples, high-frequency AC (e.g., the resonance current) may be generated by the switching operations of the two switching elements S1 and S2, and the generated high-frequency AC may be applied to the working coil WC.

Each of the snubber capacitor CSP and the DC link capacitor 200 may be electrically connected to the inverter IV.

In some examples, the inverter IV may be connected to the DC link capacitor 200 electrically in parallel and the first switching element S1 may be electrically connected to the first snubber capacitor CS1, and the second switching element S2 may be connected to the second snubber capacitor CS2

The snubber capacitor CSP is electrically connected to the inverter IV and may include the first snubber capacitor CS1 and the second snubber capacitor CS2.

In some examples, the snubber capacitor CSP may include a first snubber capacitor CS1 electrically connected to the first switching element S1 and a second snubber capacitor CS2 electrically connected to the second switching element S2.

In some examples, the first snubber capacitor CS1 and the second snubber capacitor CS2 reduce the power loss (e.g., power loss caused by hard switching) occurring when the first switching element S1 and the second switching element S2 are turned off, and in some cases, may be used to remove electromagnetic noise.

In some examples, the induction heating device 1 may include a half-bridge type inverter IV, and operating frequency of a switching signal (i.e., operating frequency of a switching signal provided by a controller 450 described below to the inverter IV to control the switching operation of the inverter IV) is greater than a resonance frequency of the switching signal, and a phase of the switching voltage Vs2 applied to the second switching element S2 is faster than a phase of a resonance current Ir applied to the working coil WC.

Figure 3:
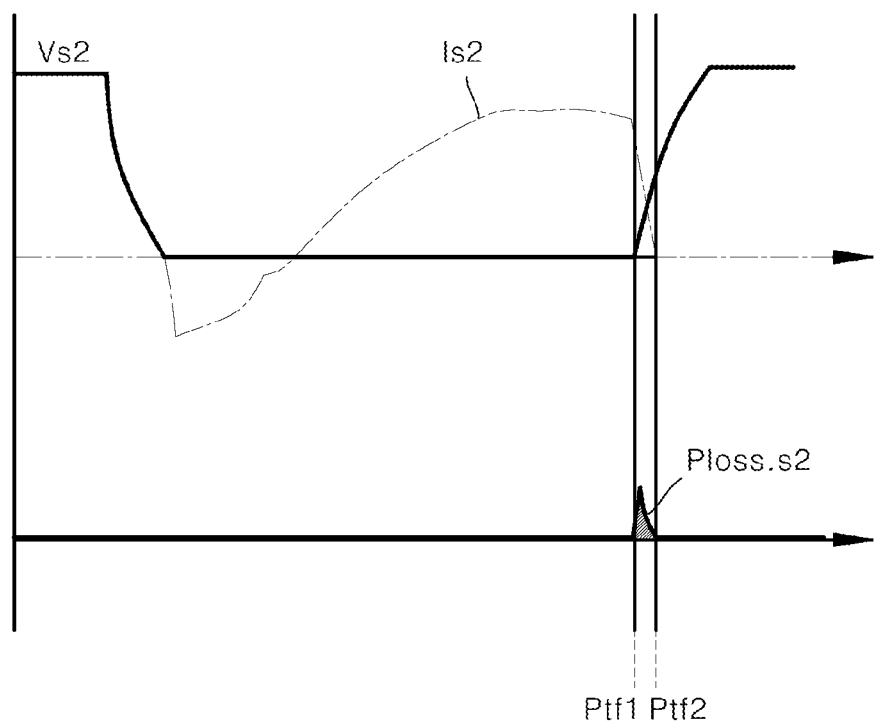
FIGS. 3 to 7 show examples of power loss caused by switching operation of an inverter shown in FIG. 2.

In some examples, as shown in FIG. 3, based on the second switching element S2 being turned off (e.g., at a time of Ptf1), the switching voltage Vs2 increases, and the switching current Is2 (e.g., current flowing through the second switching element S2) is reduced. Thus, a section (e.g., a section between a section corresponding to time PtF1 and a section corresponding to time Ptf2) in which an increase in the switching voltage Vs2 and a decrease in the switching current Is2 are overlapped with each other is generated and power loss (Ploss.s2) is generated in the corresponding section.

In order to reduce the power loss (Ploss.s2), it is desired to decrease an increase slope of the switching voltage Vs2 to minimize the above-described overlap section (i.e., a section corresponding to a time difference between time Ptf1 and time Ptf2), and the snubber capacitor (e.g., a second snubber capacitor CS2 in FIG. 3) decreases the increase slope of the switching voltage Vs2.

When the second switching element S2 is turned off, the first switching element S1 is turned on, and thus, the discharge of the first snubber capacitor CS1 may be completed before the first switching element S1 is turned on. If the discharge of the first snubber capacitor CS1 is not completed before the first switching element S1 is turned on (e.g., the discharge loss of the first snubber capacitor CS1 occurs), the discharge current Ics1 of the first snubber capacitor CS1 flows to the first switching element S1 (e.g., the discharge current Ics1 flows in a direction opposite to the direction shown in FIG. 2 and is transmitted to the first switching element S1) to cause the hard switching of the first switching element S1, which may overheat and damage the first switching element S1.

Figure 4:
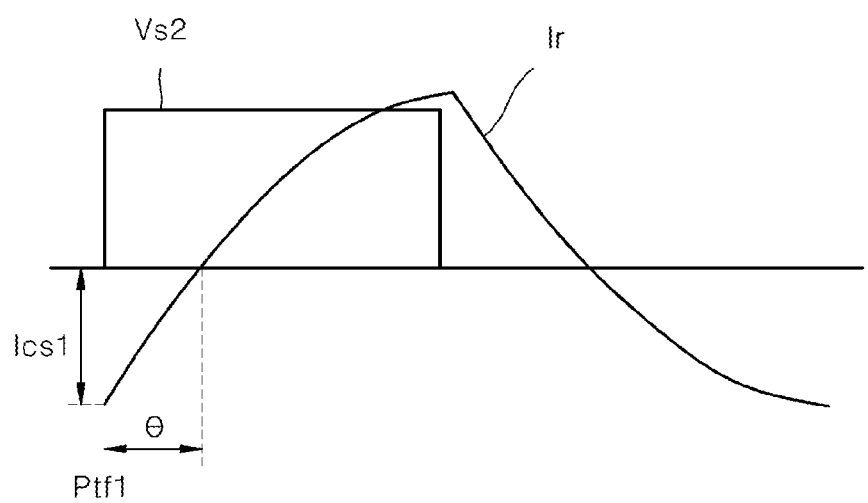
Figure 5:
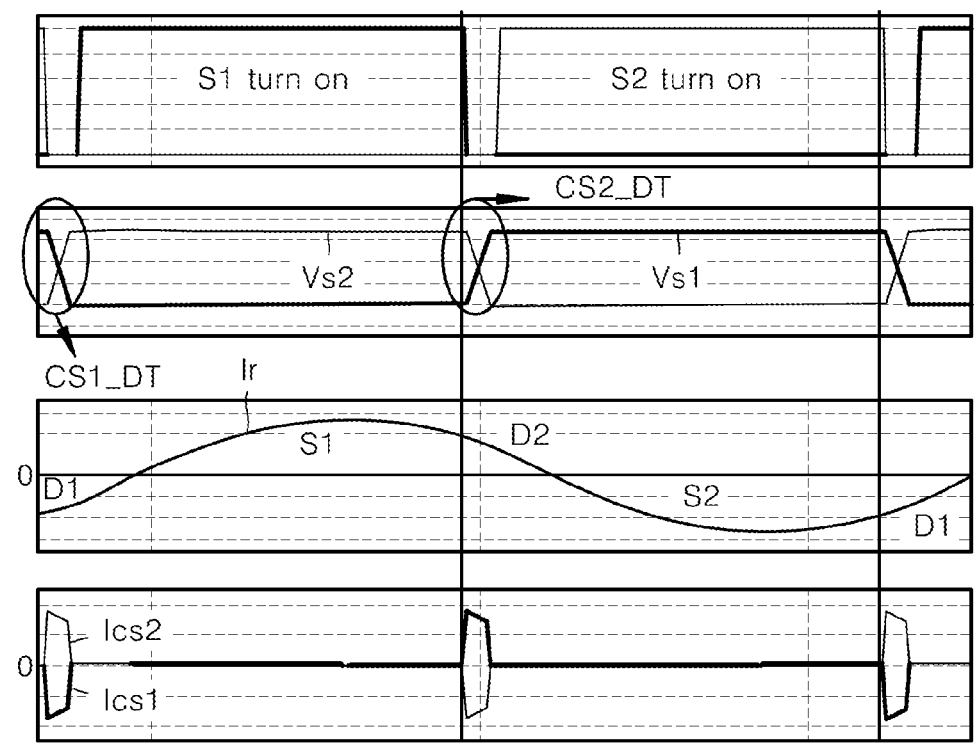
Figure 6:
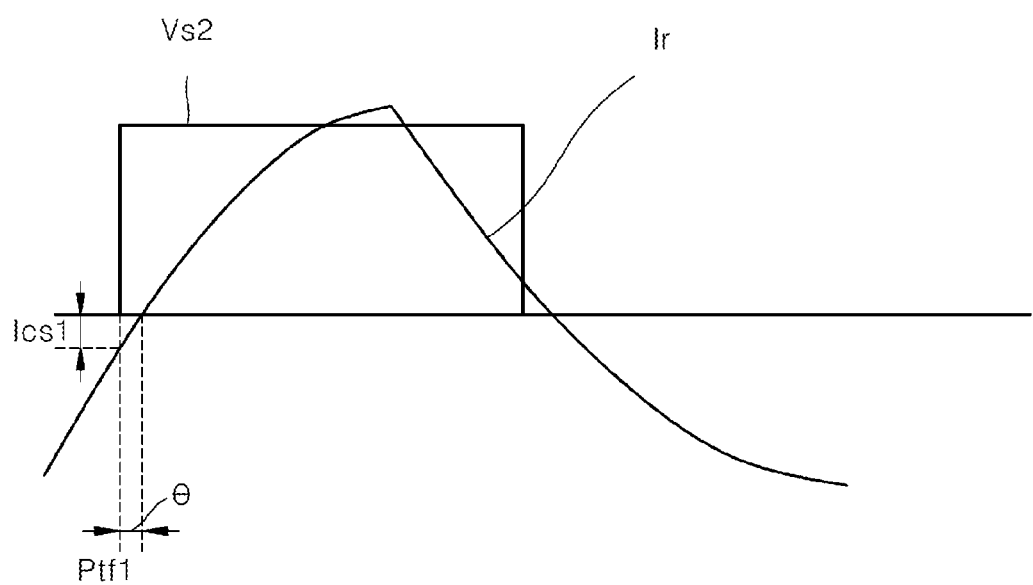
Figure 7:
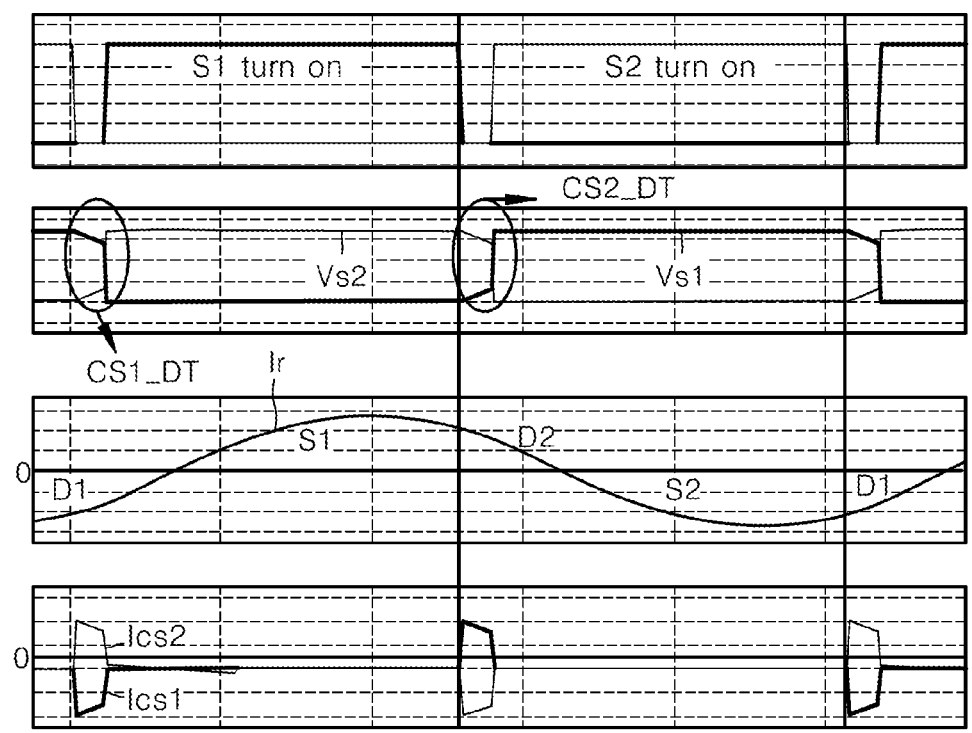

FIGS. 4 and 5 respectively show discharge of a first snubber capacitor CS1 being completed before a first switching element S1 is turned on. FIGS. 6 and 7 respectively show discharge of a first snubber capacitor CS1 being not completed before a first switching element S1 is turned on.

In some examples, a first case (the second switching element S2 is turned off and the first switching element S1 is turned on) and a second case (the second switching element S2 is turned on and the first switching element S1 is turned off) differ only in the switching elements that are turned on and off and have the same operating mechanism and occurring problem. The case in which the second switching element S2 is turned off and first switching element S1 is turned on is described in FIGS. 4 to 7.

In some examples, in contrast to FIGS. 3, 5, and 7, FIGS. 4 and 6 respectively show a waveform of the switching voltage Vs2 similar to a square wave and the waveforms in FIGS. 4 and 6 are similar to the waveforms in FIGS. 3, 5, and 7.

In some examples, the resonance current Ir flows in a sequence of a first diode D1, the first switching element S1, the second diode D2, and the second switching element S2 based on the turn-on state and the turn-off state of the first switching element S1 and the second switching element S2.

In order for the resonance current Ir to flow through the first diode D1, the voltage (e.g., Vs1) applied to the first snubber capacitor CS1 may be desired to be reduced to 0 V. In order for the resonance current Ir to flow through the second diode D2, the voltage Vs2 applied to the second snubber capacitor CS2 may be desired to be reduced to 0 V.

A section in which the voltage Vs1 applied to the first snubber capacitor CS1 is reduced to 0 V refers to a discharge section CS1_DT of the first snubber capacitor CS1. A section in which the voltage Vs2 applied to the second snubber capacitor CS2 is reduced to 0 V refers to a discharge section CS2_DT of the second snubber capacitor CS2.

In some examples, the voltage applied to the snubber capacitor becoming 0 V represents that the voltage, which has been charged in the snubber capacitor, is discharged. For example, based on the first snubber capacitor CS1 being discharged, the direction of the current Ics1 flowing through the first snubber capacitor CS1 may be an opposite direction (e.g., (−) direction) from the direction (e.g., (+) direction) shown in FIG. 2.

That is, after the voltage of the first snubber capacitor CS1 becomes 0V (i.e., after the discharge of the first snubber capacitor CS1 is completed), the first switching element S1 may be turned on to thereby prevent overheating of and the damage to the first switching element S1 caused by the hard switching of the first switching element S1.

In some examples, a magnitude of a current Ics1 (e.g., flowing through in the (−) direction) to discharge the first snubber capacitor CS1 (e.g., a magnitude of the resonance current Ir determined at a time Ptf1 when the second switching element S2 is turned off) is desired to be greater in order to complete the discharge of the first snubber capacitor CS1 before the first switching element S1 is turned on.

In some examples, the discharge time of the first snubber capacitor CS1 is inversely proportional to the magnitude of the resonance current Ir. The greater the magnitude of the resonance current Ir, the shorter the discharge time of the first snubber capacitor CS1. When the discharge time of the first snubber capacitor CS1 is desired to be shortened, the discharge of the first snubber capacitor CS1 may be completed before the first switching element S1 is turned on.

The magnitude of the resonance current Ir at a time Ptf1 when the second switching element S2 is turned off (i.e., the magnitude of the current to discharge the first snubber capacitor CS1) may be determined based on phase difference (θ) between the resonance current Ir and the switching voltage Vs2.

In some examples, the greater the phase difference θ between the resonance current Ir and the switching voltage Vs2, the greater the magnitude of the resonance current Ir at the time Ptf1 when the second switching element S2 is turned off, and the less the phase difference θ between the resonance current Ir and the switching voltage Vs2, the less the magnitude of the resonance current Ir at the time Pft1 when the second switching element S2 is turned off.

That is, as shown in FIGS. 4 and 5, based on the phase difference θ between the resonance current Ir and the switching voltage Vs2 being greater, the magnitude of resonance current Ir determined at a time Ptf1 when the second switching element S2 is turned off is increased and the discharge time of the first snubber capacitor CS1 is shortened. Thus, the discharge of the first snubber capacitor CS1 is completed before the first switching element S1 is turned on.

In some implementations, as shown in FIGS. 6 and 7, based on the phase difference θ between the resonance current Ir and the switching voltage Vs2 being less, the magnitude of the resonance current Ir determined at the time Ptf1 when the second switching element S2 is turned off is reduced and the discharge time of the first snubber capacitor Cs1 is lengthened. Therefore, the time taken to fully discharge the first snubber capacitor CS1 becomes insufficient. As a result, the first switching element S1 is turned on when the discharge of the first snubber capacitor CS1 is not completed. As a result, the switching voltage Vs1 applied to the first switching element S1 is suddenly decreased to 0 V.

In this case (e.g., when a discharge loss of the first snubber capacitor CS1 occurs), the discharge current Ics1 of the first snubber capacitor CS1 flows to the first switching element S1 to thereby cause the hard switching of the first switching element S1. As a result, the first switching element S1 may be overheated and damaged.

In some implementations, the induction heating device 1 may adjust the operating frequency based on the phase difference θ, and details thereof are described below.

In some examples, the working coil WC may receive a resonance current from the inverter IV.

In some examples, a first end of the working coil WC may be electrically connected to the phase detector 220 and the inverter IV, and a second end of the working coil WC may be electrically connected to the resonance capacitor CR.

In some examples, an eddy current may be generated between the working coil WC and the object (e.g., a cooking vessel) based on the high-frequency AC applied from the inverter IV to the working coil WC to thereby heat the object.

The resonance capacitor CR may be electrically connected to the working coil WC.

In some examples, the resonance capacitor CR may be connected to the working coil WC electrically in series and may form a resonant circuit with the working coil WC. For example, a first end of the resonance capacitor CR may be electrically connected to the working coil WC, and a second end of the resonance capacitor CR may be electrically connected to a ground G.

When voltage is applied to the resonance capacitor CR by the switching operation of the inverter IV, the resonance capacitor CR resonates. In some cases where the resonance capacitor CR resonates, a magnitude of a current flowing through the working coil WC electrically connected to the resonance capacitor CR is increased.

The eddy current is induced in the object disposed above the working coil WC electrically connected to the resonance capacitor CR through this process.

The phase detector 220 is connected between the inverter IV and the working coil WC and may detect the phase difference between the resonance current Ir applied to the working coil WC and the switching voltage Vs2 applied to the second switching element S2.

In some examples, the phase detector 220 may provide the controller 450 with information on the detected phase difference. In some examples, the phase detector 220 may perform the phase difference detection operation in real time or periodically, and details of the phase detector 220 are described below.

The input interface 500 may receive a touch input from a user and may transmit the received touch input to the controller 450. For example, input interface 500 may include a touch panel, a pressure sensor, a knob, a display panel including a touch sensor, or the like.

In some examples, the input interface 500 inputs a heating intensity or driving time of an induction heating device desired by a user, and may be variously implemented as a physical button or a touch panel and may receive touch input from a user to provide the touch input to the controller 450.

The controller 450 receives information on the phase difference detected by the phase detector 220 and provides the inverter IV with a switching signal to control the switching operation, and may adjust the operating frequency of the switching signal based on the information on the phase difference to control the output of the working coil WC. For example, the controller 450 may include an electric circuit, a microprocessor, a computer, a communication device, or the like.

In some examples, the controller 450 may detect the magnitude of the resonance current Ir and the magnitude of the switching voltage Vs2 through connection with the phase detector 220 and may calculate the output value of the working coil WC based on the detected magnitude of the resonance current Ir, the magnitude of the switching voltage Vs2, and the information on the phase difference.

In some examples, when an output value of the working coil WC is Pwc and the phase difference is θ, $Pwc=\frac{1}{2} \times Vs2 \times Ir \times \cos\theta$.

In some examples, based on touch input (e.g., touch input received at the controller 450 from the input interface 500) representing an output command value for the working coil WC (e.g., a command value of target output intensity of the working coil WC), the controller 450 may compare the output command value with the calculated output value of the working coil after the calculation is performed and may adjust the operating frequency of the switching signal based on a result of comparison of the output command value with the output value of the working coil.

The controller 450 adjusts the operating frequency of the switching signal based on the information on the phase difference according to the comparison result and details thereof are described below.

An output control method of the controller 450 shown in FIG. 2 is described below with reference to FIGS. 8 and 9.

Figure 8:
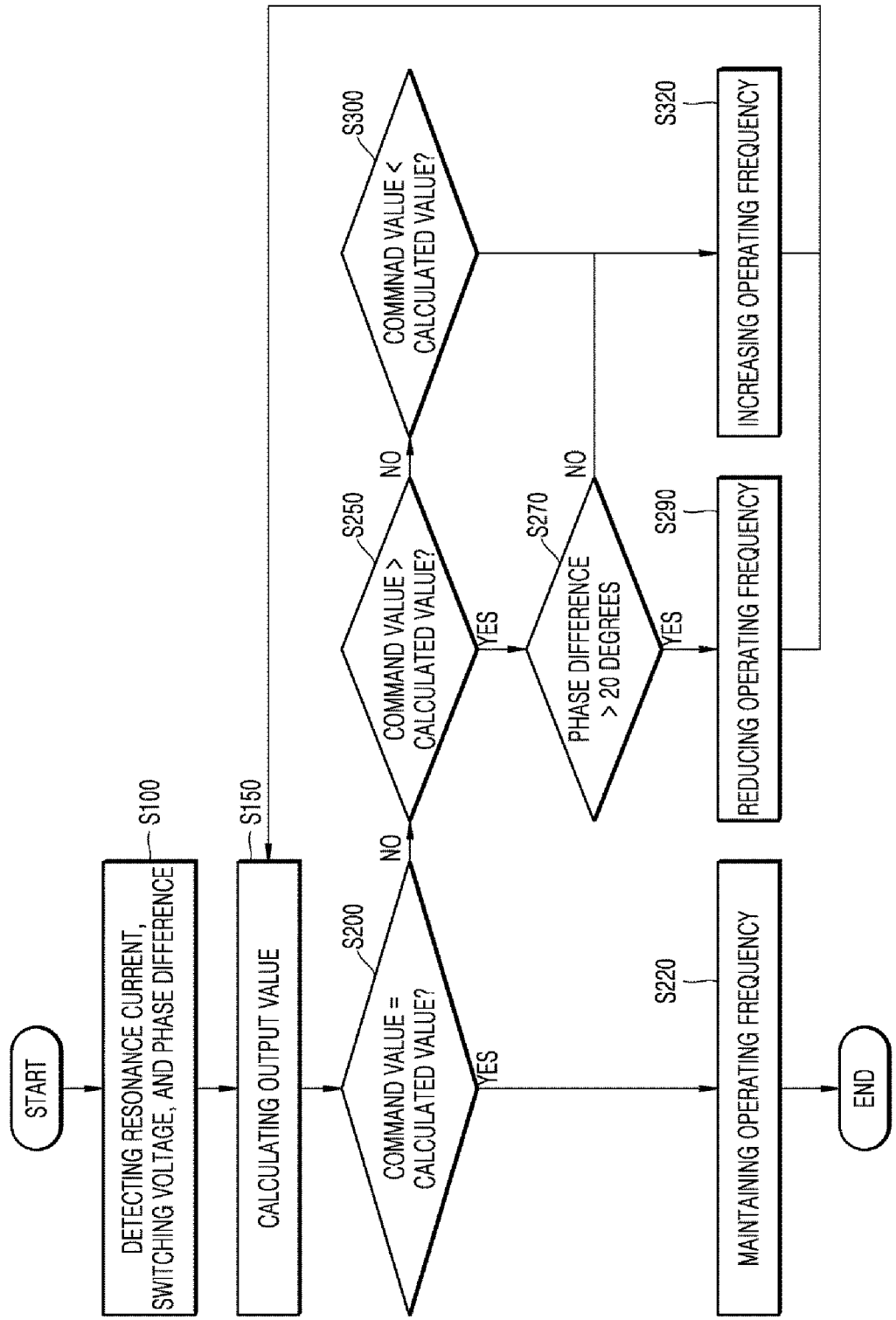
FIG. 8 is a flowchart showing an example of an output control method of a controller shown in FIG. 2.

FIG. 8 is a flowchart showing an example of an output control method of a controller shown in FIG. 2. FIG. 9 is a graph showing an example of an output control method of a controller shown in FIG. 2.

Figure 9:
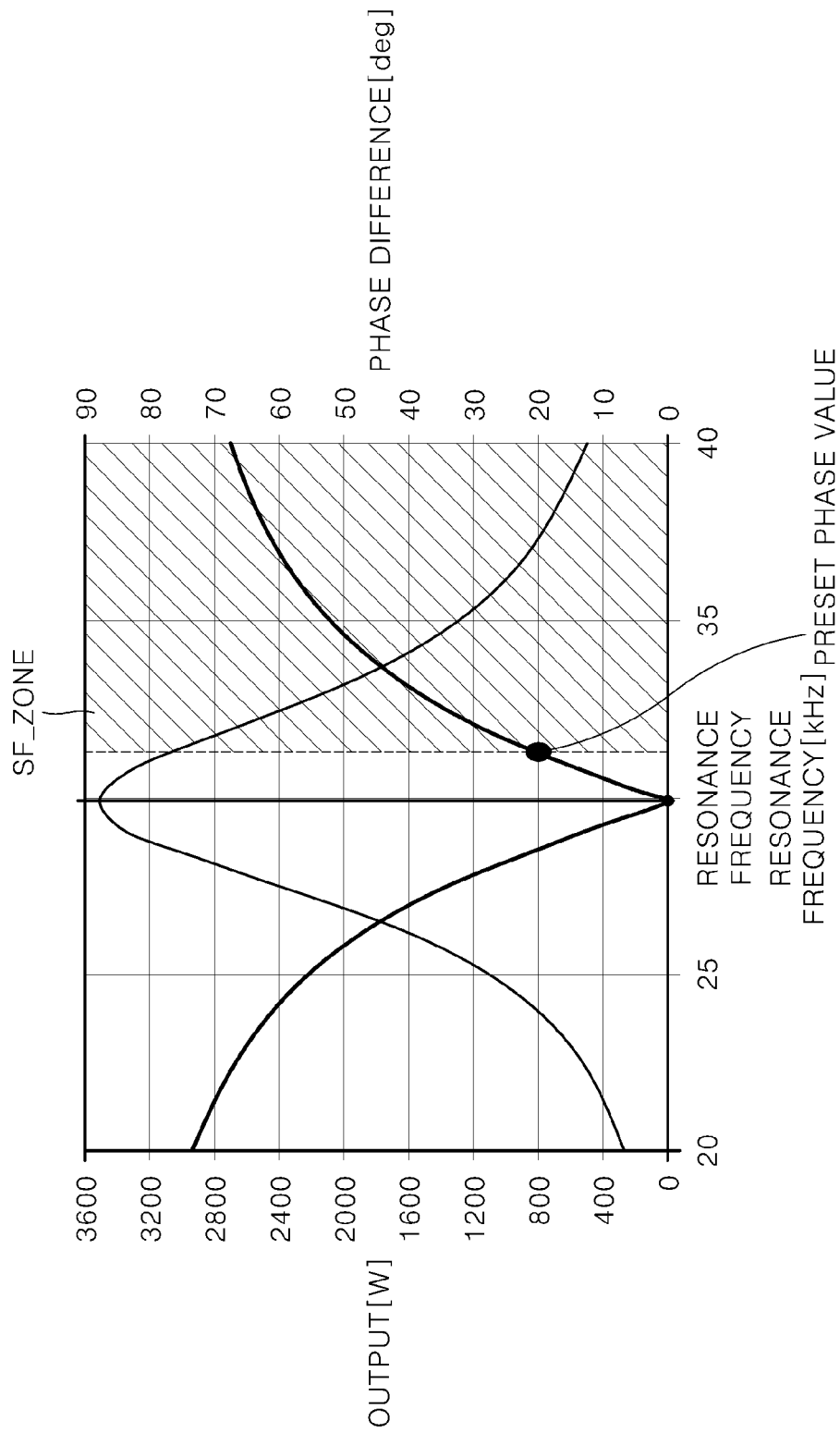
FIG. 9 is a graph showing an example of an output control method of the controller shown in FIG. 2.

Referring to FIGS. 2, 8, and 9, the resonance current Ir, the switching voltage Vs2, and the phase difference between the resonance current Ir and the switching voltage Vs2 are detected (S100).

In some examples, based on the touch input (e.g., the touch input received from the input interface 500 and received at the controller 450) representing an output command value with respect to the working coil WC (e.g., the command value with respect to a target output intensity of the working coil WC), the controller 450 may detect the magnitude of the resonance current Ir and the magnitude of the switching voltage Vs2 to calculate the output value of the working coil WC.

In some examples, the phase detector 220 may detect the phase difference between the resonance current Ir and the switching voltage Vs2 to provide the controller 450 with the information on the detected phase difference.

When the detecting operation is completed (S100), the output value of the working coil WC is calculated (S150).

In some examples, the controller 450 may calculate the output value of the working coil WC based on the detected magnitude of the resonance current Ir and magnitude of the switching voltage Vs2, and the phase difference between the resonance current Ir and the switching voltage Vs2 received from the phase detector 220.

When the calculation operation is completed (S150), the output command value (indicated as 'the command value' in FIG. 8) is compared with the calculated output value (indicated as 'operation value' in FIG. 8) of the working coil WC (S200, S250, and S300).

In some examples, based on the output command value being identical to the calculated output value of the working coil WC (S200), the controller 450 may maintain the operating frequency of the switching signal (S220).

In this case, the output intensity of the working coil WC may also be maintained.

In some examples, based on the output command value being greater than the calculated output value of the working coil WC (S250), the controller 450 may compare the phase difference with a preset phase value (e.g., 20° (20 degrees)) and may adjust the operating frequency of the switching signal based on the comparison of the phase difference with the preset phase value.

That is, based on the phase difference being greater than or equal to the preset phase value (S270), the controller 450 may reduce the operating frequency of the switching signal (S290), and based on the phase difference being less than the preset phase value (S270), the controller 450 may increase the operating frequency of the switching signal (S320).

In some cases where the operating frequency of the switching signal decreases, the output intensity of the working coil WC increases, and where the operating frequency of the switching signal increases, the output intensity of the working coil WC decreases.

As shown in FIG. 9, based on the output command value being greater than the calculated output value of the working coil WC and the phase difference being equal to or greater than a preset phase value (e.g., 20 degrees), when the controller 450 reduces the operating frequency of the switching signal, the phase difference is decreased and the output intensity of the working coil WC is increased.

In some examples, based on the output command value being greater than the calculated output value of the working coil WC and the phase difference being less than a preset phase value (e.g., 20 degrees), when the controller 450 increases the operating frequency of the switching signal, the output intensity of the working coil WC is decreased and the phase difference is increased to enter a safety zone SF_ZONE (e.g., an area in which discharge loss of the snubber capacitor is not generated).

In some examples, in order for the phase difference to enter the safety zone SF_ZONE, the controller 450 may increase the operating frequency of the switching signal to an operating frequency or more corresponding to a preset phase value (e.g., 20 degrees).

The preset phase value may refer to a minimum phase difference desired to complete the discharge of the first snubber capacitor CS1 before the first switching element S1 is turned on after the second switching element S2 is turned off.

In some cases where the phase difference being greater than or equal to a preset phase value (e.g., when the phase difference is in the safe zone SF_ZONE where no discharge loss occurs), the discharge of the first snubber capacitor CS1 may be completed before the first switching element S1 is turned on after the second switching element S2 is turned off.

In some examples, based on the phase difference being greater than or equal to a preset phase value (e.g., based on the phase difference existing in the safety zone SF_ZONE where no discharge loss occurs), the magnitude of the resonance current Ir is increased at a time point (for example, Ptf1 of FIG. 4) when the second switching element S2 is turned off and the discharge time of the first snubber capacitor CS1 is shortened. Thus, the discharge of the first snubber capacitor CS1 may be completed before the first switching element S1 is turned on.

In some cases where the output command value being less than the calculated output value of the working coil WC (S300), the controller 450 may increase the operating frequency of the switching signal (S320).

In this case, the output intensity of the working coil WC decreases.

In some examples, after S290 or S320, the process goes back to S150 again to repeatedly perform the above-mentioned processes.

In some implementations, the method of controlling the output of the controller 450 is performed, and the induction heating device 1 may prevent or reduce the discharge loss of the snubber capacitor (e.g., the first snubber capacitor CS1 and the second snubber capacitor CS2). In some examples, the hard switching of the switching element (e.g., the first switching element S1 and the second switching element S2) may be restricted, and the switching element may avoid overheat and damage by the hard switching of the switching element to thereby prevent or reduce the discharge loss of the snubber capacitor.

In some implementations, the controller 450 of the induction heating device 1 performs the above-described output control method. An example of the phase detector 220 shown in FIG. 2 is described below with reference to FIGS. 10 to 20.

Figure 10:
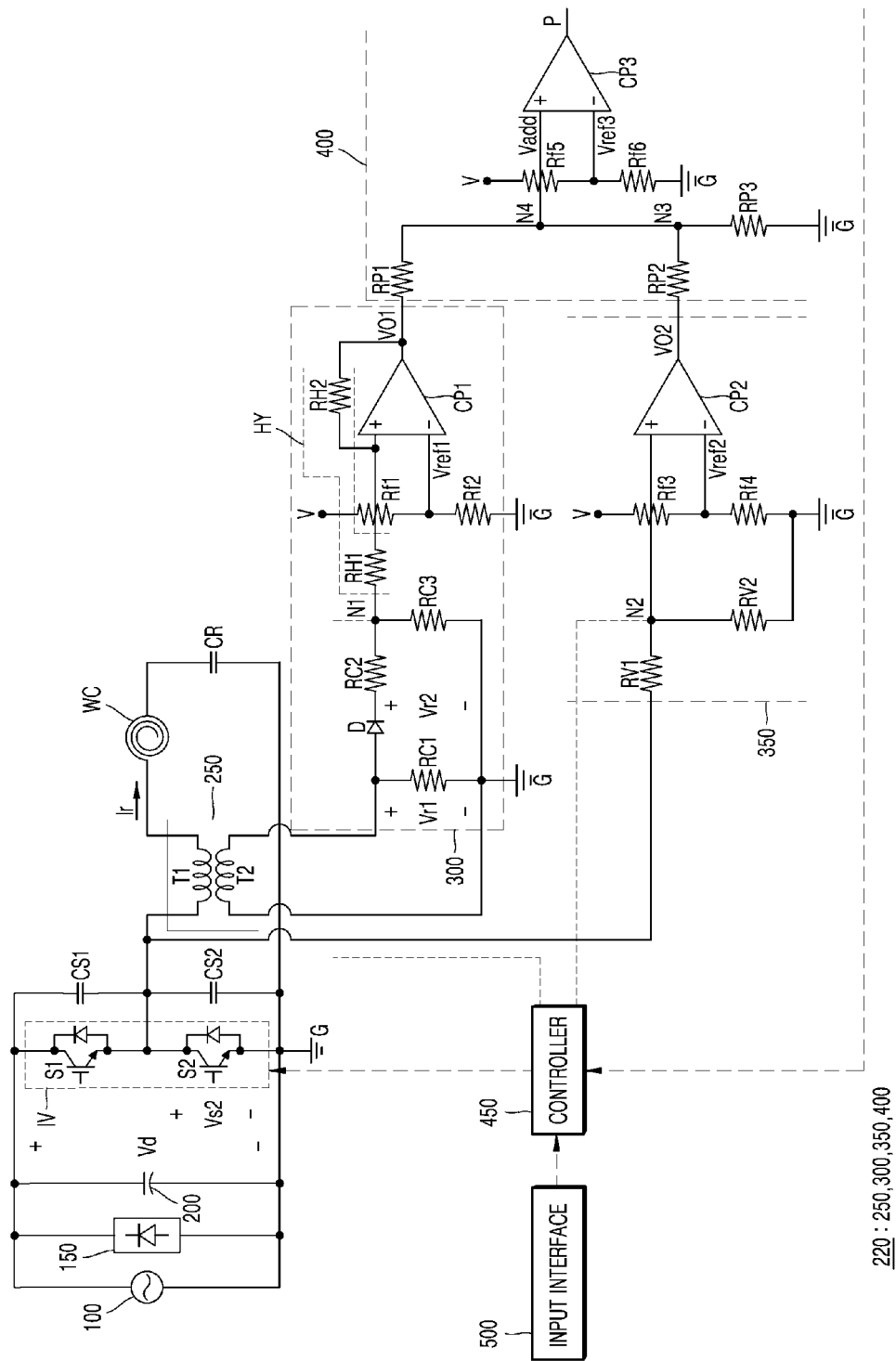
FIG. 10 is a circuit diagram showing an example of a phase detector shown in FIG. 2.
Figure 11:
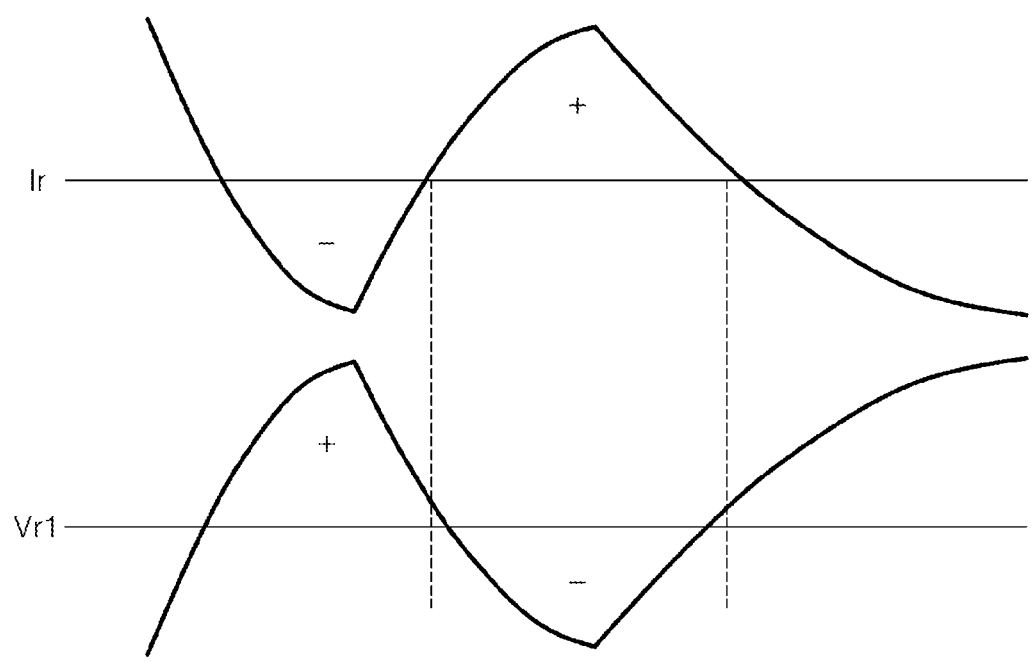
FIG. 11 shows an example voltage applied to a first current detecting resistor in FIG. 10.
Figure 12:
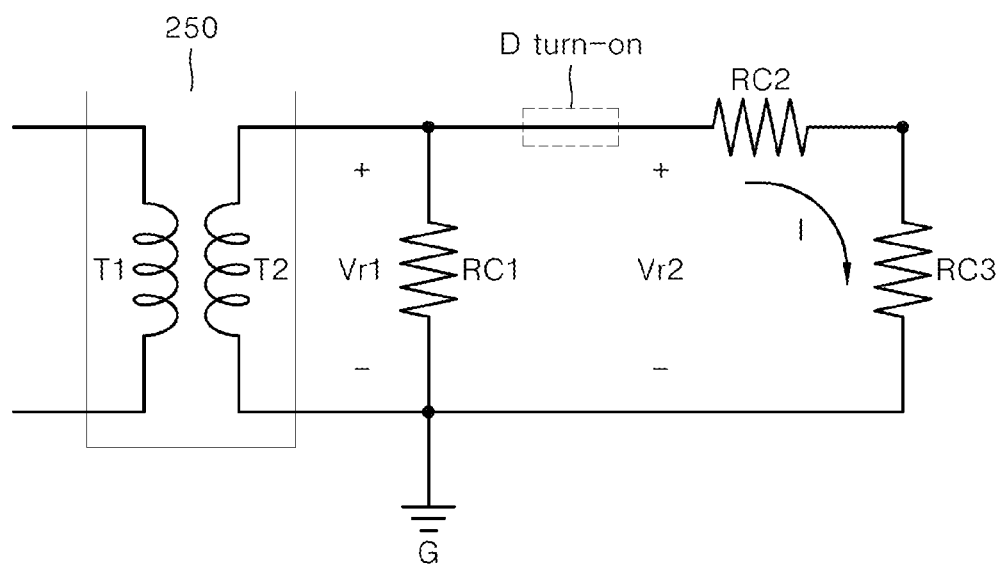
FIGS. 12 to 14 show examples operations of diodes shown in FIG. 10.
Figure 13:
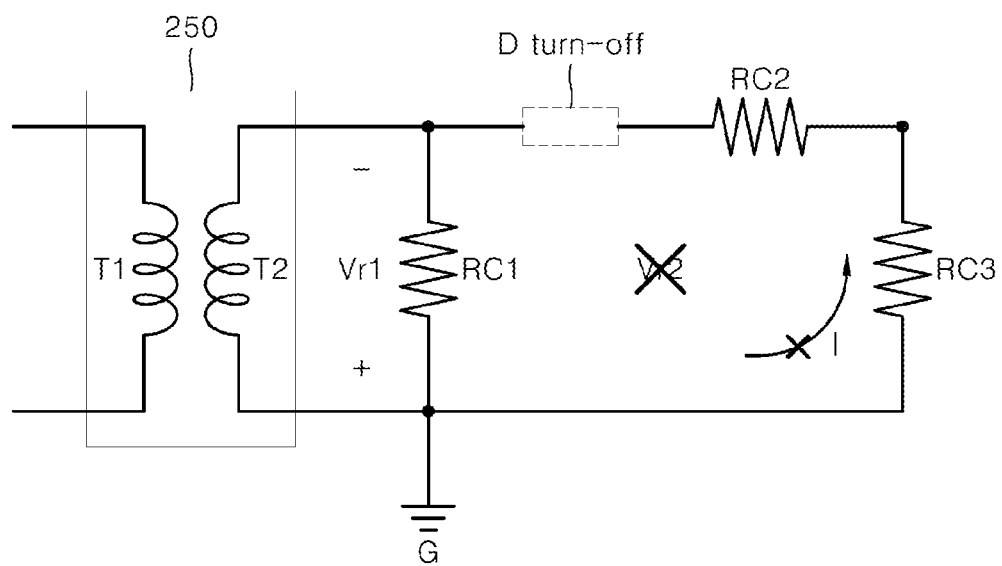
Figure 14:
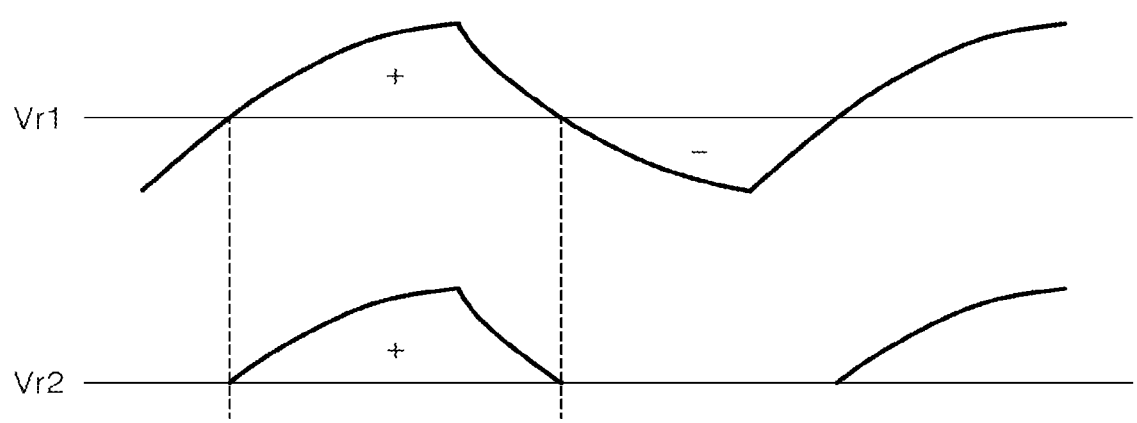
Figure 15:
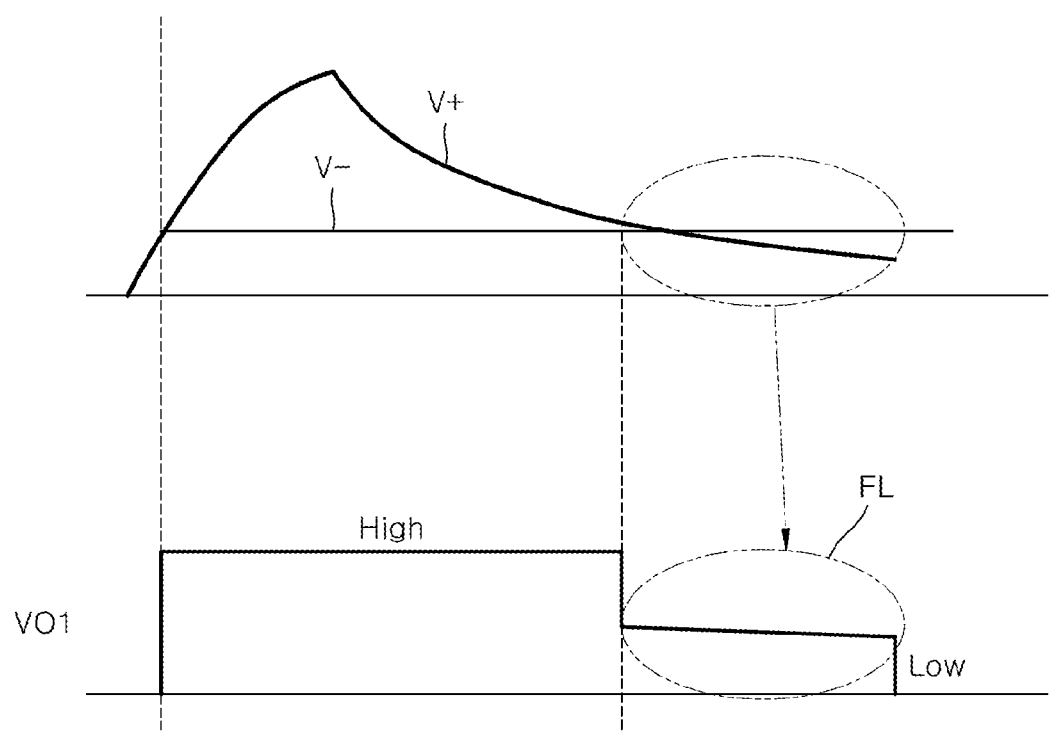
FIG. 15 shows an example of a hysteresis circuit shown in FIG. 10 that is not electrically connected to a first comparator.
Figure 16:
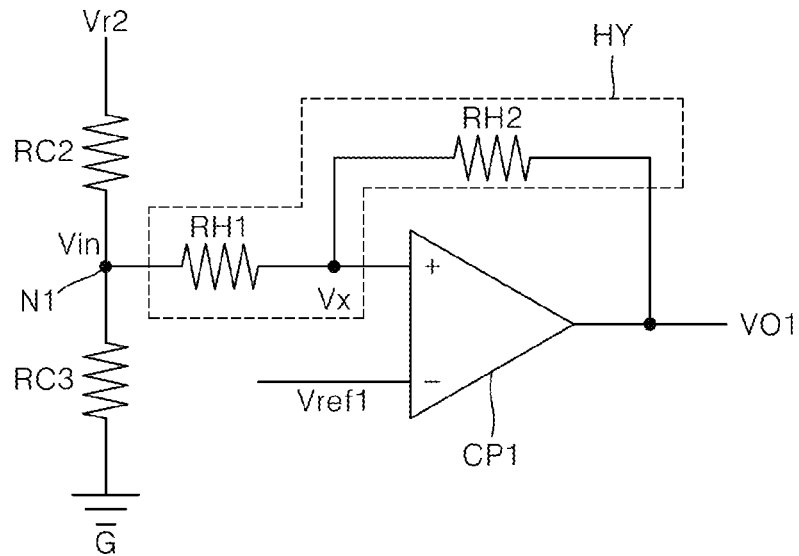
FIG. 16 shows an example of a hysteresis circuit shown in FIG. 10.
Figure 16:
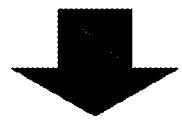
Figure 16:
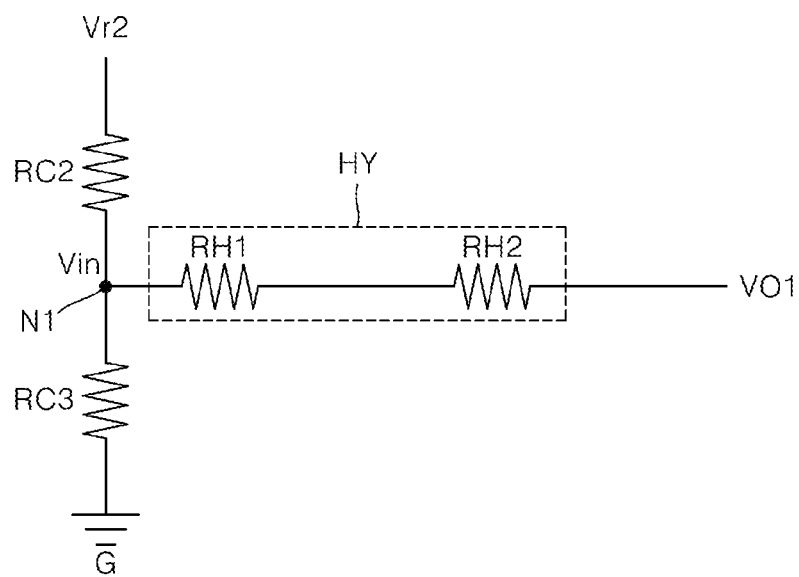
Figure 17:
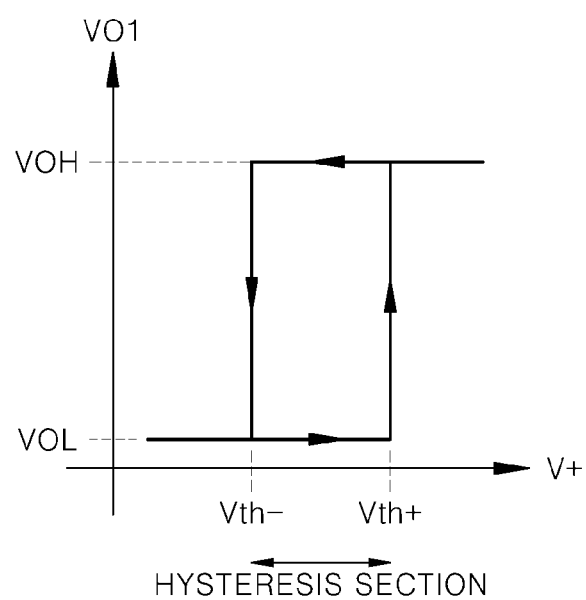
FIGS. 17 and 18 respectively show examples of input and output of a first comparator shown in FIG. 10.
Figure 18:
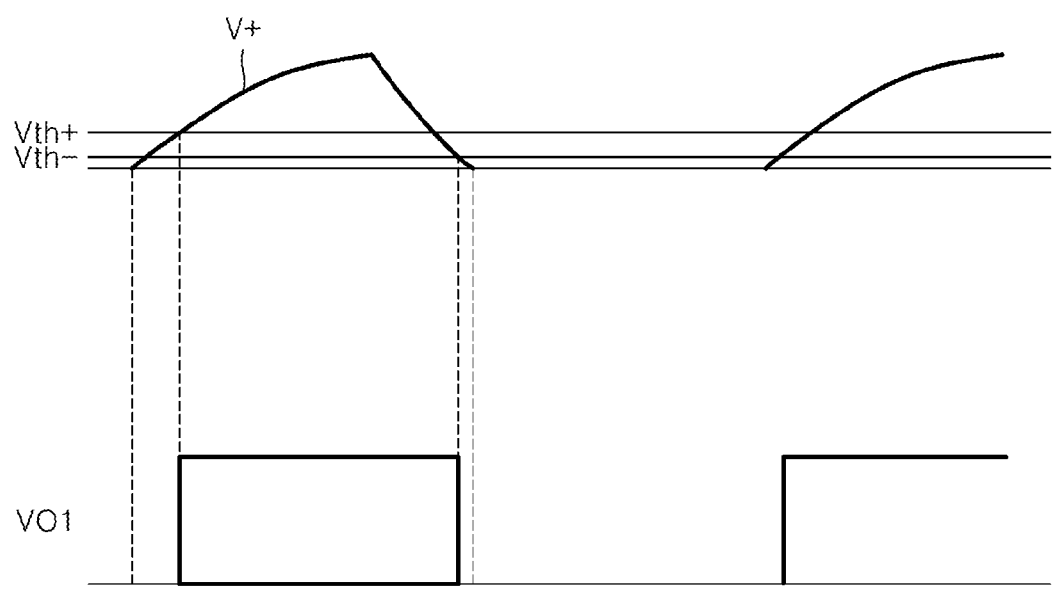
Figure 19:
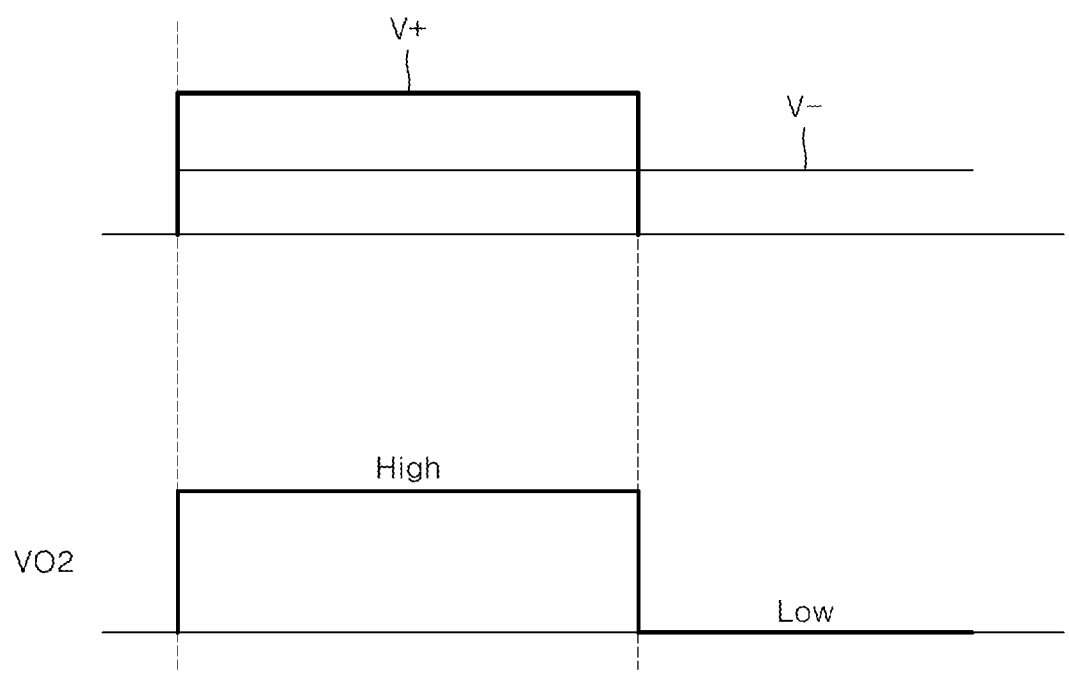
FIG. 19 shows an example of second voltage output from a voltage detecting circuit shown in FIG. 10.
Figure 20:
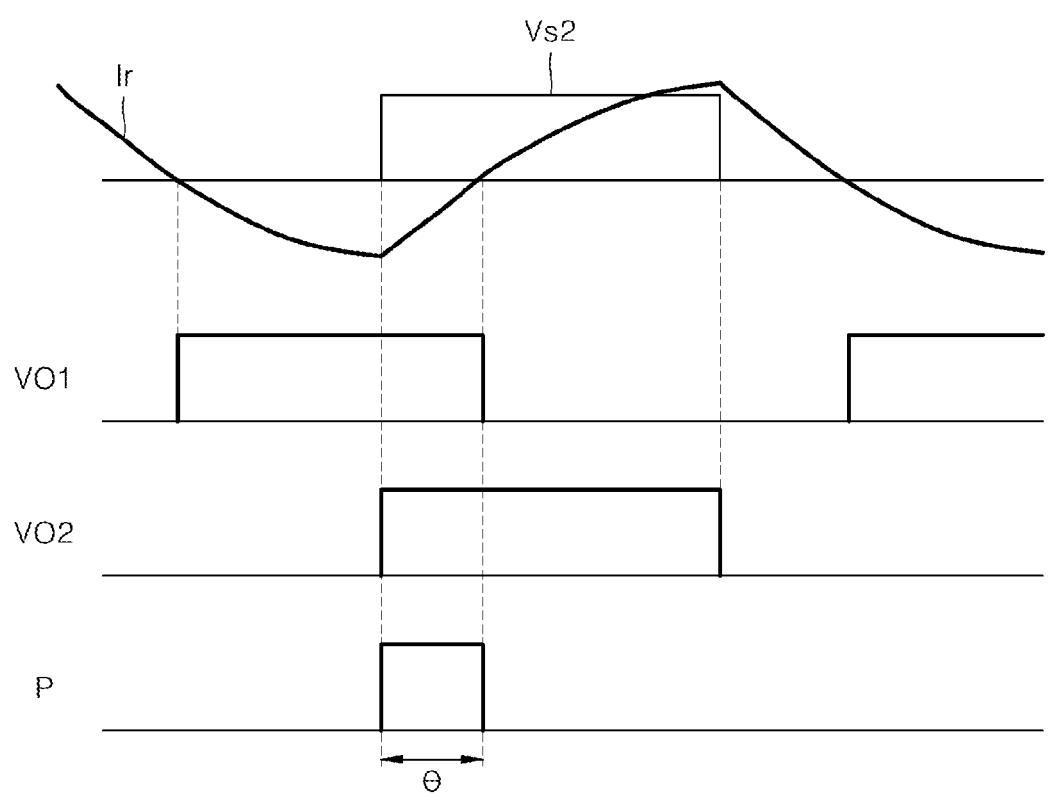
FIG. 20 shows an example of a phase difference detection mechanism of an induction heating device in FIG. 10.

FIG. 10 is a circuit diagram showing an example phase detector shown in FIG. 2. FIG. 11 shows an example voltage applied to a first current detecting resistor in FIG. 10. FIGS. 12 to 14 respectively show an example of a function of a diode shown in FIG. 10. FIG. 15 shows an example of a hysteresis circuit shown in FIG. 10 that is not electrically connected to a first comparator. FIG. 16 shows an example of a hysteresis circuit shown in FIG. 10. FIGS. 17 and 18 show examples of input and output of a first comparator shown in FIG. 10. FIG. 19 shows an example of a second voltage output by a voltage detection circuit shown in FIG. 10. FIG. 20 shows an example of a phase difference detection mechanism of the induction heating device in FIG. 10.

In some implementations, referring to FIGS. 10 to 20, the phase detector 220 of the induction heating device 1 may include a current transformer 250, a current detecting circuit 300, a voltage detecting circuit 350, and an AND circuit 400. The AND circuit 400 may be referred to as an output circuit.

The current transformer 250 includes a first stage T1 electrically connected between the inverter IV and the working coil WC, and a resonance current Ir applied to the working coil WC flows through the first stage T1. The current transformer 250 may change the magnitude of the resonance current Ir flowing through the first stage T1 and may provide the current detecting circuit 300 with the resonance current having the changed magnitude. The first stage T1 may include a first coil.

In some examples, the magnitude information related to the resonance current Ir applied to the working coil WC is used to calculate the output value of the controller 450, and the magnitude of the resonance current Ir may be desired to be reduced to a specific magnitude or less (e.g., a magnitude of the resonance current Ir measured by the controller 450) in order for the controller 450 to use magnitude information related to the resonance current Ir. The current transformer 250 reduces the magnitude of the resonance current Ir to a specific magnitude or less.

The current transformer 250 includes a first stage T1 in which a coil is wound around the first stage T1 and a second stage T2 in which a coil is wound around the second stage T2. The first stage T1 is electrically connected between the inverter IV and the working coil WC and the second stage T2 may be electrically connected to the current detecting circuit 300 (e.g., the first current detecting resistor RC1). In some examples, the current transformer 250 may change the magnitude of the current flowing through the first stage T1 and may apply the current having the changed magnitude to the second stage T2.

The resonance current Ir applied to the working coil WC from the inverter IV flows through the first stage T1 and the resonance current having the less magnitude than the magnitude of the resonance current Ir flowing through the first stage T1 may be applied to the second stage T2. The second stage T2 may include a second coil.

In some examples, a number of coil windings of each of the first stage T1 and the second stage T2 is inversely proportional to the magnitude of the current flowing through each of the first stage T1 and the second stage T2 and a number of coil windings of the second stage T1 is greater than a number of coil windings of the first stage T1, and thus, the magnitude of the resonance current applied to the second stage T2 may be less than the magnitude of the resonance current flowing through the first stage T1.

The current detecting circuit 300 may be electrically connected to the current transformer 250 to receive the resonance current of which the magnitude is converted, and may output the first voltage VO1 based on the received resonance current. In some examples, the current detecting circuit 300 may output the first voltage VO1 to provide the AND circuit 400 with the first voltage VO1.

In some examples, the current detecting circuit 300 may include a first current detecting resistor RC1 to a third current detecting resistor RC3, a diode D, a first comparator CP1, and a hysteresis circuit HY.

The first current detecting resistor RC1 may be electrically connected to the second stage T2 of the current transformer 250.

In some examples, the first current detecting resistor RC1 is electrically connected to the second stage T2 of the current transformer 250, and the resonance current applied to the second stage T2 may be converted into resonance voltage Vr1 that flows in an opposite direction to the direction of the resonance current through the first current detecting resistor RC1.

For example, as shown in FIG. 11, the direction of the resonance current Ir flowing through the first stage T1 of the current transformer 250 may be opposite to the direction of the resonance voltage Vr1 applied to the first current detecting resistor RC1 through the second stage T2 of the current transformer 250.

The direction of the resonance voltage Vr1 is determined based on a reference (e.g., a ground G) when the resonance voltage Vr1 applied to the first current detecting resistor R is measured.

The diode D may be electrically connected to the first current detecting resistor RC1.

In some examples, a first end of the diode D may be electrically connected to the first current detecting resistor RC1, and a second end of the diode D may be electrically connected to the second current detecting resistor RC2.

In some examples, the diode D may remove the negative voltage from the resonance voltage Vr1 converted through the first current detecting resistor RC1.

For example, based on voltage of a first end of the diode D being greater than voltage of a second end of the diode D, the diode D is turned on, and thus, the current flows form a first end of the diode D to the second end of the diode D, and based on voltage of the first end of the diode D being less than the voltage of the second end of the diode D, the diode D is turned off, and thus, the current may not flow through the diode D.

That is, as shown in FIGS. 12 and 14, when the resonance voltage Vr1 applied to the first current detecting resistor RC1 is (+), the diode D is turned on and the current I flows through the second current detecting resistor RC2 and the third current detecting resistor RC3, and the voltage Vr2 having the same magnitude as the voltage Vr1 applied to the first current detecting resistor RC1 may be applied to the second current detecting resistor RC2 and the third current detecting resistor RC3.

In some implementations, as shown in FIGS. 13 and 14, based on the resonance voltage Vr1 applied to the first current detecting resistor RC1 being (−), the diode D is turned off and the circuit is opened. Thus, the current I may not flow through the second current detecting resistor RC2 and the third current detecting resistor RC3, and the magnitude of the voltage Vr2 applied to the second current detecting resistor RC2 and the third current detecting resistor RC3 may be 0 V.

In some examples, resonance voltage Vr2 in which (−) voltage of the resonance voltage Vr1 applied to the first current detecting resistor RC1 is removed (i.e., voltage in a (+) section of the resonance voltage Vr1 and corresponding to a section in which the resonance current Ir is (−)) may be applied to the second current detecting resistor and the third current detecting resistor RC3.

The second current detecting resistor RC2 may be connected to the diode D electrically in series.

In some examples, a first end of the second current detecting resistor RC2 may be electrically connected to the diode D, and a second end of the second current detecting resistor RC2 may be electrically connected to the third current detecting resistor RC3.

In some examples, the second current detecting resistor RC2 is used to distribute the resonance voltage Vr2 from which the negative voltage is removed.

The third current detecting resistor RC3 may be connected to the second current detecting resistor RC2 electrically in series.

In some examples, a first end of the third current detecting resistor RC3 may be electrically connected to the second current detecting resistor RC2, and a second end of the third current detecting resistor RC3 may be electrically connected to the ground G.

Like the second current detecting resistor RC2, the third current detecting resistor RC3 is also used to distribute the resonance voltage Vr2 from which the above-mentioned negative voltage is removed.

In some examples, resonance voltage distributed to the third current detecting resistor RC3 may be applied to a positive input terminal of the first comparator CP1 (i.e., a (+) input terminal of the first comparator CP1). The voltage applied to the positive input terminal of the first comparator CP1 may be desired to be less than the driving voltage to drive the first comparator CP1 to distribute the resonance voltage Vr2 from which the negative voltage is removed to the second current detecting resistor RC2 and the third current sensing resistance RC3 and to apply the resonance voltage distributed to the third current sensing resistance RC3 to the positive input terminal of the first comparator CP1.

The first comparator CP1 may be electrically connected to the first node N1 between the second current detecting resistor RC2 and the third current detecting resistor RC3 to output the first voltage VO1.

In some examples, the first comparator CP1 may compare the resonance voltage applied to the positive input terminal with the first reference voltage Vref1 applied to the negative input terminal (e.g., (−) input terminal of the first comparator CP1), and may determine the first voltage VO1 based on a result of comparison of the resonance voltage applied to the positive input terminal with the first reference voltage Vref1 applied to the negative input terminal.

In some examples, the controller 450 is connected to the first node N1 to detect the magnitude of the voltage applied to the first node N1, and may detect the magnitude of the resonance current Ir applied to the working coil WC based on the detected magnitude of the voltage.

In some examples, the first reference voltage Vref1 may ideally be a ground voltage (i.e., 0 V), but may be set to be voltage having a specific magnitude in consideration of a voltage drop caused by leakage current or noise. In some examples, the first reference voltage Vref1 may be applied to the second reference resistor Rf2 when voltage V having a specific magnitude is distributed using a first reference resistor Rf1 and a second reference resistor Rf2.

As shown in FIG. 15, based on the magnitude of the resonance voltage V+ applied to the positive input terminal being equal to or greater than the magnitude of the voltage V− applied to the negative input terminal (for reference, the voltage V− is the same as Vref1 in FIG. 10), the first comparator CP1 may determine the value of the first voltage VO1 as the voltage value having the preset magnitude of, for example, 5V (i.e., in a high state).

In some examples, based on the magnitude of the resonance voltage V+ applied to the positive input terminal being less than the magnitude of the voltage V− applied to the negative input terminal (for reference, voltage V− is the same as Vref1 in FIG. 10), the first comparator CP1 may determine the value of the first voltage VO1 as voltage in a low state (e.g., 0V).

FIG. 15 shows an example of a hysteresis circuit HY that is not electrically connected to the first comparator CP1, and based on the magnitude of the resonance voltage V+ applied to the positive input terminal continuously becoming close to the magnitude of the voltage V− applied to the negative input terminal, a floating section FL may be generated.

"Floating" refers that the value of the first voltage VO1 output from the first comparator CP1 is a voltage value other than voltage in the high state (e.g., a preset magnitude of voltage value of 5 V) or voltage in the low state (e.g., 0 V).

The first comparator CP1 may include a complementary metal-oxide semiconductor (CMOS) type comparator (e.g., TLV3502) and the floating section FL shown in FIG. 15 may be generated. The current detecting circuit 300 may include a hysteresis circuit HY to restrict the generation of the floating section FL. In some cases, the comparator may include an operational amplifier (op amp) that is manufactured by a CMOS process technology.

In some examples, the hysteresis circuit HY may be electrically connected between the first node N1 and the output terminal of the first comparator C.

In some examples, the hysteresis circuit HY may include a hysteresis resistor RH1 electrically connected between the first node N1 and the positive input terminal of the first comparator CP1 and a second hysteresis resistor RH2 in which a first end of the second hysteresis resistor is electrically connected between the first hysteresis resistor RH1 and the positive input terminal and a second end of the second hysteresis resistor RH2 is electrically connected to the output terminal of the first comparator CP1.

In some examples, the resonance voltage Vr2 from which the negative voltage is removed by the diode D may be applied to the positive input terminal of the first comparator CP1 through a voltage distribution process performed by the second current detecting resistor RC2 and the third current detecting resistor RC3 and the first hysteresis resistor RH1 and the second hysteresis resistor RH2.

In some examples, as shown in FIG. 16, the circuit shown at an upper portion of FIG. 16 may be converted into an equivalent circuit, for example, the circuit shown at a lower portion of FIG. 16. In some examples, referring to the circuit shown in the lower portion of FIG. 16, the resonance voltage Vr2 and the first voltage VO1 have a parallel configuration.

Due to this parallel configuration, the voltage Vin applied to the first node N1 may be affected by the first voltage VO1 as well as the resonance voltage Vr2. Further, due to the influence of the first voltage VO1, a function of the hysteresis circuit HY (e.g., restricting the generation of the floating section FL) may be difficult to be properly performed.

Voltage Vin may be defined by the following Equation 1. In some examples, in the following, (R∥R') refers to a parallel composite resistance value between R and R'.

$$Vin = \frac{RC3\|(RH1+RH2)}{RC2+(RC3\|(RH1+RH2))}Vr2 +$$  ⟨Equation 1⟩

-continued
$$\frac{(RC2\|RC3)}{(RH1+RH2)+(RC2\|RC3)}VO1$$

As defined in Equation 1, a sum of a resistance value of the first hysteresis resistor and a resistance value of the second hysteresis resistor (e.g., RH1+RH2) may be greater to reduce the effect of the first voltage VO1 on voltage Vin.

In some examples, in an example of the phase detector 220, the values of the first hysteresis resistor RH1 and the second hysteresis resistor RH2 may be set to be greater than the values of the second current detecting resistor RC2 and the third current detecting resistor RC3 to thereby perform a function of the hysteresis circuit HY (e.g., the restriction of the generation of the floating section FL) by reducing the effect of the first voltage VO1.

Subsequently, as shown in FIG. 17, the first comparator CP1 to which the hysteresis circuit HY is applied may have two reference voltages, in contrast to a general comparator. In some examples, the first comparator CP1 has a hysteresis-type output voltage value graph based on two reference voltages.

That is, in the case of a general comparator, the output voltage value is determined to be in the high state or the low state based on one reference voltage applied to the negative input terminal.

In some examples, the first comparator CP1 to which the hysteresis circuit HY is electrically connected may have a plus threshold reference voltage Vth+ to convert the output voltage value (e.g., the first voltage VO1) from the voltage in the low state VOL to the voltage in the high state VOH and minus threshold reference voltage Vth− to change the output voltage VO1 from the voltage in the high state VOH to the voltage in the low state VOL.

In some examples, the first comparator CP1 may calculate a plus threshold reference voltage Vth+ and a minus threshold reference voltage Vth− based on the first reference voltage Vref1 applied to the negative input terminal, may compare the resonance voltage V+ (e.g., Vx in FIG. 16) applied to the positive input terminal through the voltage distribution process with the plus threshold reference voltage Vth+ or the minus threshold reference voltage Vth− and may determine the value of the first voltage VO1 based on the result of comparison of the resonance voltage V+(e.g., Vx in FIG. 16) applied to the positive input terminal through the voltage distribution process with the plus threshold reference voltage Vth+ or the minus threshold reference voltage Vth−.

In some examples, in the first comparator CP1 to which the hysteresis circuit HY is electrically connected, the voltage V+(e.g., Vx in FIG. 16) applied to the positive input terminal may be the first reference voltage Vref1 to change the state of the output voltage value VO1 from the low state VOL to the high state VOH (i.e., for V+ to change, there is a time point when V+ is equal to Vref1). Conditions of the voltage Vin to satisfy that voltage Vx becomes the first reference voltage Vref1 are defined in the following Equation 2 and Equation 3.

$$Vx = Vref1 = \frac{RH2}{RH1+RH2}Vin + \frac{RH1}{RH1+RH2}VOL$$  ⟨Equation 2⟩

$$Vin = \frac{RH1+RH2}{RH2}Vref1 - \frac{RH1}{RH2}VOL$$  ⟨Equation 3⟩

In some examples, the plus threshold reference voltage Vth+ may be defined as described in Equation 4 below using the above Equation 3.

$$Vth+ = Vin = \frac{RH1}{RH2}(Vref1 - VOL) + Vref1 \qquad \langle\text{Equation 4}\rangle$$

In some examples, in the first comparator CP1 to which the hysteresis circuit HY is electrically connected, the voltage V+(e.g., voltage Vx in FIG. 16) applied to the positive input terminal may be the above-mentioned first reference voltage Vref1 to change the state of the output voltage value VO1 from the high state VOH to the low state VOL (i.e., V+ which is greater than the first reference voltage Vref1 is reduced to Vref1 and the Vref1 is reduced to V+ which is less than Vref1). Conditions of Vin to satisfy that voltage Vx becomes the first reference voltage Vref1 in FIG. 16 are defined in Equation 5 and Equation 6 below.

$$Vx = Vref1 = \frac{RH2}{RH1+RH2}Vin + \frac{RH1}{RH1+RH2}VOH \qquad \langle\text{Equation 5}\rangle$$

$$Vin = \frac{RH1+RH2}{RH2}Vref1 - \frac{RH1}{RH2}VOH \qquad \langle\text{Equation 6}\rangle$$

In some examples, the minus threshold reference voltage Vth– may be defined as described in Equation 7 below using the above Equation 6.

$$Vth- = Vin = \frac{RH1}{RH2}(Vref1 - VOH) + Vref1 \qquad \langle\text{Equation 7}\rangle$$

The first comparator CP1 to which the hysteresis circuit HY is electrically connected has two reference voltages (e.g., plus threshold reference voltage Vth+ and minus threshold reference voltage Vth–). As shown in FIG. 18, based on the voltage V+ applied to the plus input terminal being equal to or greater than the plus threshold reference voltage Vth+(i.e., based on V+, which has been reduced than Vth+, becoming equal to or greater than Vth+), the first comparator CP1 outputs the value of the first voltage VO1 in the high state, and based on the voltage V+ applied to the positive input terminal being equal to or less than the minus threshold reference voltage Vth+(i.e., based on V+, which has been greater than Vth–, becoming equal to or less than Vth–), the first comparator CP1 may output the value of the first voltage VO1 in the low state.

FIG. 15 shows an example of a hysteresis circuit HY that is not electrically connected to the first comparator CP1. FIG. 18 shows an example of a hysteresis circuit HY being electrically connected to the first comparator CP1.

That is, in the example of the phase detector 220, the hysteresis circuit HY is electrically connected to the first comparator CP1, and the input and output of the first comparator CP1 is implemented as shown in FIG. 18. The first comparator CP1 may help to prevent the floating phenomenon shown in FIG. 15.

In some examples, the voltage detecting circuit 350 is electrically connected to the inverter IV to receive the switching voltage Vs2 applied to the second switching element S2, and may output the second voltage VO2 based on the received switching voltage Vs2. In some examples, the voltage detecting circuit 350 may output the second voltage VO2 to provide the AND circuit 400 with the second voltage VO2.

In some examples, the voltage detecting circuit 350 may include the first voltage sensing resistor RV1, the second voltage sensing resistor RV2, and a second comparator CP2.

The first voltage sensing resistor RV1 may be electrically connected to the second switching element S2.

In some examples, a first end of the first voltage sensing resistor RV1 may be electrically connected to the second switching element S2, and a second end of the first voltage sensing resistor RV1 may be electrically connected to the second voltage sensing resistor RV2.

In some examples, the first voltage sensing resistor RV1 is used to distribute the switching voltage Vs2 provided by the inverter IV to the voltage detecting circuit 350.

The second voltage sensing resistor RV2 and the first voltage sensing resistor RV1 may be connected to each other electrically in series.

In some examples, a first end of the second voltage sensing resistor RV2 may be electrically connected to the first voltage sensing resistor RV1, and a second end of the second voltage sensing resistor RV2 may be electrically connected to the ground G.

The second voltage sensing resistor RV2 is also used for voltage distribution of the above-described switching voltage Vs2, like the first voltage sensing resistor RV1.

In some examples, the switching voltage Vs2 provided by the inverter IV to the voltage detecting circuit 350 is distributed to the first voltage sensing resistor RV1 and the second voltage sensing resistor RV2 and the switching voltage distributed to the second voltage sensing resistor RV2 may be applied to the positive input terminal of the second comparator CP2 (e.g., (+) input terminal of the second comparator CP2). In some examples, the voltage applied to the positive input terminal of the second comparator CP2 may be less than the driving voltage to drive the second comparator CP2 to distribute the switching voltage Vs2 to the first voltage sensing resistor RV1 and the second voltage sensing resistor RV2 and to apply the switching voltage distributed to the second voltage sensing resistor RV2 to the positive input terminal of the second comparator CP2.

The second comparator CP2 may be electrically connected to the second node N2 between the first voltage sensing resistor RV1 and the second voltage sensing resistor RV2 to output the second voltage VO2.

In some examples, the second comparator CP2 compares the switching voltage applied to the positive input terminal with the second reference voltage Vref2 applied to the negative input terminal (e.g., the (–) input terminal of the second comparator CP2) and may determine the value of the second voltage VO2 based on the result of comparison of the switching voltage applied to the positive input terminal with the second reference voltage Vref2 applied to the negative input terminal.

In some examples, the controller 450 is electrically connected to the second node N2 to detect the magnitude of the voltage applied to the second node N2 and may detect the magnitude of the switching voltage Vs2 applied to the second switching element S2 based on the detected magnitude of the voltage.

In some examples, the second reference voltage Vref2 is ideally ground voltage (i.e., 0 V) but may be set to be the voltage having the specific magnitude in consideration of the voltage drop caused by leaking current or the noise. In some examples, the second reference voltage Vref2 may be applied to a fourth reference resistor Rf4 when the voltage V having the specific magnitude is distributed using the third reference resistor Rf3 and the fourth reference resistor Rf4.

As shown in FIG. 19, based on the magnitude of the switching voltage V+ applied to the positive input terminal being greater than or equal to the voltage V− applied to the negative input terminal (for reference, a magnitude of V− is the same as the second reference voltage Vref2 in FIG. 10). The second comparator CP2 may determine the value of the second voltage VO2 as a voltage value (e.g., 5V) having a predetermined magnitude (e.g., in a high state).

In some implementations, based on the magnitude of the switching voltage V+ applied to the positive input terminal being less than the magnitude of the voltage V− applied to the negative input terminal (for reference, V− is the same as the second reference voltage Vref2 in FIG. 10), the second comparator CP2 may determine the value of the second voltage VO2 as the voltage in a low state (e.g., 0 V).

In some examples, in contrast to the first comparator CP1, the switching voltage Vs2 having the shape of a square wave is distributed and applied to the positive input terminal of the second comparator CP2, and the magnitude of the switching voltage V+ applied to the positive input terminal is significantly different from the magnitude of the voltage V− applied to the negative input terminal instantaneously at a specific time point to thereby occur no floating.

In some examples, the hysteresis circuit is not electrically connected to the second comparator CP2.

In some examples, the second comparator CP2 may include a CMOS type comparator like the first comparator CP1, but is not limited thereto.

The AND circuit 400 may receive the first voltage VO1 and the second voltage VO2 from the current detecting circuit 300 and the voltage detecting circuit 350, respectively, and may output the pulse P based on the received first voltage VO1 and second voltage VO2. In some examples, the AND circuit 400 may output the pulse P to provide the controller 450 with the pulse P.

In some examples, the AND circuit 400 may include the first pulse generation resistor RP1 and the third pulse generation resistor RP3 and a third comparator CP3.

The first pulse generation resistor RP1 may be electrically connected to an output terminal of the current detecting circuit 300 (e.g., an output terminal of the first comparator CP1.

In some examples, a first end of the first pulse generation resistor RP1 may be electrically connected to the output terminal of the first comparator CP1 and a second end of the first pulse generation resistor RP1 may be electrically connected to the fourth node N4.

The fourth node N4 is disposed between the third node N3 between the second pulse generation resistor RP2 and the third pulse generation resistor RP3 and the first pulse generation resistor RP1.

The second pulse generation resistor RP2 may be electrically connected to an output terminal of the voltage detecting circuit 350 (e.g., an output terminal of the second comparator CP2).

In some examples, a first end of the second pulse generation resistor RP2 may be connected to the output terminal of the second comparator CP2 and a second end of the second pulse generation resistor RP2 may be connected to the third node N3.

The third node N3 is disposed between the second pulse generation resistor RP2 and the third pulse generation resistor RP3.

The third pulse generation resistor RP3 may be electrically connected between the second pulse generation resistor RP2 and ground G.

In some examples, a first end of the third pulse generation resistor RP3 may be electrically connected to the third node N3 and a second end of the third pulse generation resistor RP3 may be electrically connected to the ground G.

In some examples, the third pulse generation resistor RP3 distributes the voltage with the first pulse generation resistor RP1 and the second pulse generation resistor RP2 and the voltage Vadd applied to the positive input terminal of the third comparator CP3 (e.g., the (+) input terminal of the third comparator CP3) is less than the driving voltage to drive the third comparator CP3.

For example, the first voltage VO1 output from the current detecting circuit 300 is applied to the fourth node N4 through a first voltage distribution process by the first pulse generation resistor RP1 and the third pulse generation resistor RP3. The second voltage VO2 output from the voltage detecting circuit 350 may be applied to the fourth node N4 through a second voltage distribution process performed by the first pulse generation resistor RP1 and the third pulse generation resistor RP3. In some examples, the voltage applied to the fourth node N4 through the first voltage distribution process and the voltage applied to the fourth node N4 through the second voltage distribution process are combined with each other and the combined voltages may be applied to the positive input terminal of the third comparator CP3.

The voltage Vadd applied to the positive input terminal of the third comparator CP3 may be defined as described in Equation 8 below.

$$Vadd = \frac{(RP2\|RP3)}{RP1 + (RP2\|RP3)}VO1 + \frac{(RP1\|RP3)}{RP2 + (RP1\|RP3)}VO2 \quad \langle \text{Equation 8} \rangle$$

In some examples, the third comparator CP3 is electrically connected to the fourth node N4 between the third node N0 and the first pulse generation resistor RP1, where the third node N3 is disposed between the second pulse generation resistor RP2 and the third pulse generation resistor RP3 to output the pulse P.

In some examples, the third comparator CP3 may compare the voltage applied to the positive input terminal (e.g., the (+) input terminal of the third comparator CP3) with the third reference voltage Vref3 applied to the negative input terminal (e.g., the (−) input terminal of the third comparator CP3) and may generate the pulse P based on the result of comparison of the voltage applied to the positive input terminal with the third reference voltage Vref3 applied to the negative input terminal.

In some examples, assuming that a resistance value of the first pulse generation resistor RP1 and a resistance value of the second pulse generation resistor RP2 are 100 KΩ, respectively, and resistance value of the third pulse generation resistor RP3 is 18 KΩ, the voltage Vadd applied to the positive input terminal of the third comparator CP3 is 0.66 V when the first voltage VO1 is 5 V and the second voltage VO2 is 0 V, the voltage Vadd applied to the positive input terminal of the third comparator CP3 is 0.66V when the first voltage VO1 is 0 V and the second voltage VO2 is 5 V, and the voltage Vadd applied to the positive input terminal of the third comparator CP3 may be 1.32 V when the first voltage VO1 is 5 V and the second voltage VO2 is 5 V.

In this case, the magnitude of the third reference voltage Vref3 may be set to be in a range of 0.66 V to 1.32 V (e.g., 1 V) and the pulse P may be output as the pulse in the high state (e.g., "1" or 'the voltage value having the specific magnitude) only when the first voltage VO1 and the second voltage VO2 are voltages in the high state (e.g., 5V). In some examples, the pulse Pin the low state (e.g., "0") may be output in other cases (e.g., in the case of any one of the first voltage VO1 and the second voltage VO2 in the low state).

That is, when both the first voltage VO1 and the second voltage VO2 are in the high state, the AND circuit 400 outputs a pulse P in the high state, and when any one of the first voltage VO1 and the second voltage VO2 is in the low state, the AND circuit 400 may output the pulse P in the low state.

In some examples, the third reference voltage Vref3 may be applied to a sixth reference resistor Rf6 when voltage V having the specific magnitude is distributed using a fifth reference resistor Rf5 and the sixth reference resistor Rf6.

In some examples, based on the magnitude of the voltage Vadd applied to the positive input terminal being greater than or equal to the magnitude of the third reference voltage Vref3 applied to the negative input terminal, the third comparator CP3 may generate the pulse P in the high state.

In some implementations, based on the magnitude of the voltage Vadd applied to the positive input terminal being less than the magnitude of the third reference voltage Vref3 applied to the negative input terminal, the third comparator CP3 may generate the pulse P in a low state.

A width (θ) (see FIG. 20) of the pulse P output from the AND circuit 400 represents information on a phase difference between the resonance current Ir applied to the working coil WC and the switching voltage Vs2 applied to the second switching element S2 (i.e., time delay between a zero-crossing point of the resonance current Ir and a zero-crossing point of the switching voltage Vs2).

That is, the controller 450 receives the pulse P from the AND circuit 400, and the width θ of the pulse P provided by the AND circuit 400 represents the above-described phase difference information.

In some examples, like the second comparator CP2, the voltage Vadd having the shape of a square wave is applied to the positive input terminal of the third comparator CP3 and the floating may not be generated by the third comparator CP3.

In some examples, the hysteresis circuit is not electrically connected to the third comparator CP3.

In some examples, the third comparator CP3 may include a CMOS type comparator like the first comparator CP1, but is not limited thereto.

The current detecting circuit 300 and the voltage detecting circuit 350 output the first voltage VO1 and the second voltage VO2 through the above-described process, and the AND circuit 400 outputs the pulse P based on the first voltage VO1 and the second voltage VO2 received from the current detecting circuit 300 and the voltage detecting circuit 350. This mechanism is shown in FIG. 20 in brief.

In some examples, the above-described mechanism is simply and clearly shown in FIG. 20 based on assumption that the first reference voltage Vref1 and the second reference voltage are each 0V.

An example of the phase detector 220 includes above-described configuration and features. Another example of the phase detector 220 shown in FIG. 2 is described below with reference to FIGS. 21 to 23.

Figure 21:
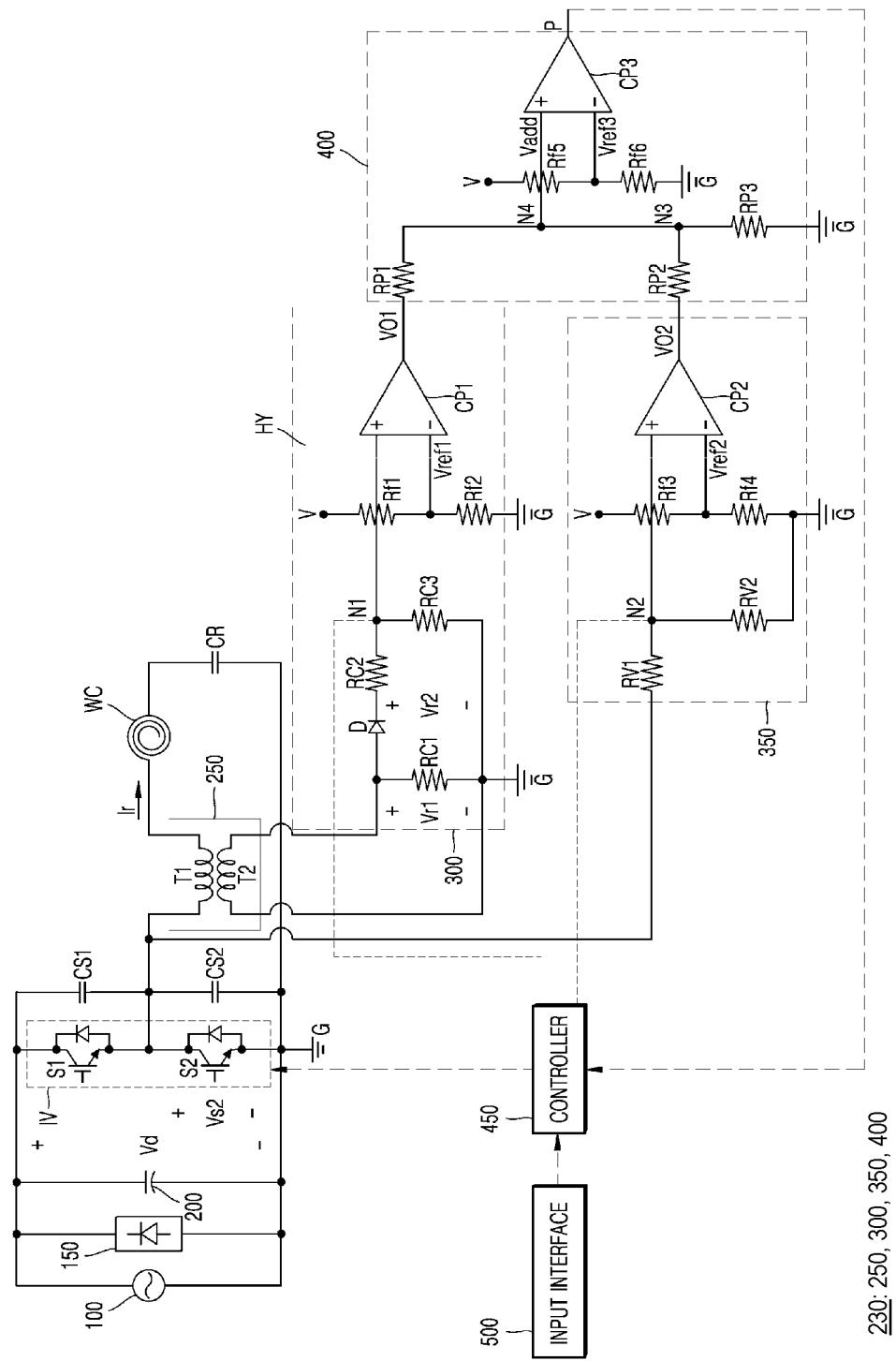
FIG. 21 is a circuit diagram showing another example of a phase detector shown in FIG. 2.
Figure 22:
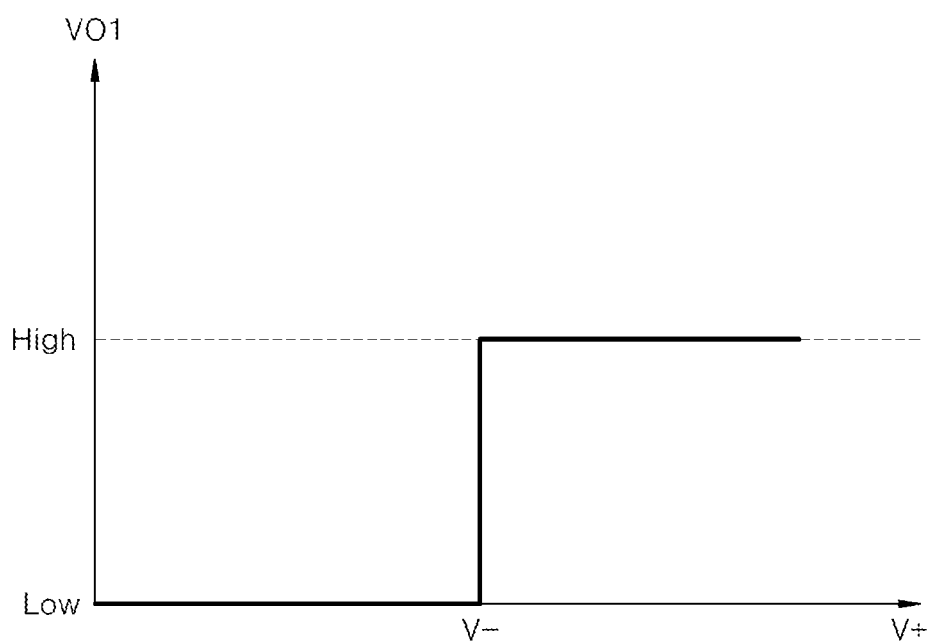
FIGS. 22 and 23 respectively show examples of input and output of a first comparator shown in FIG. 21.
Figure 23:
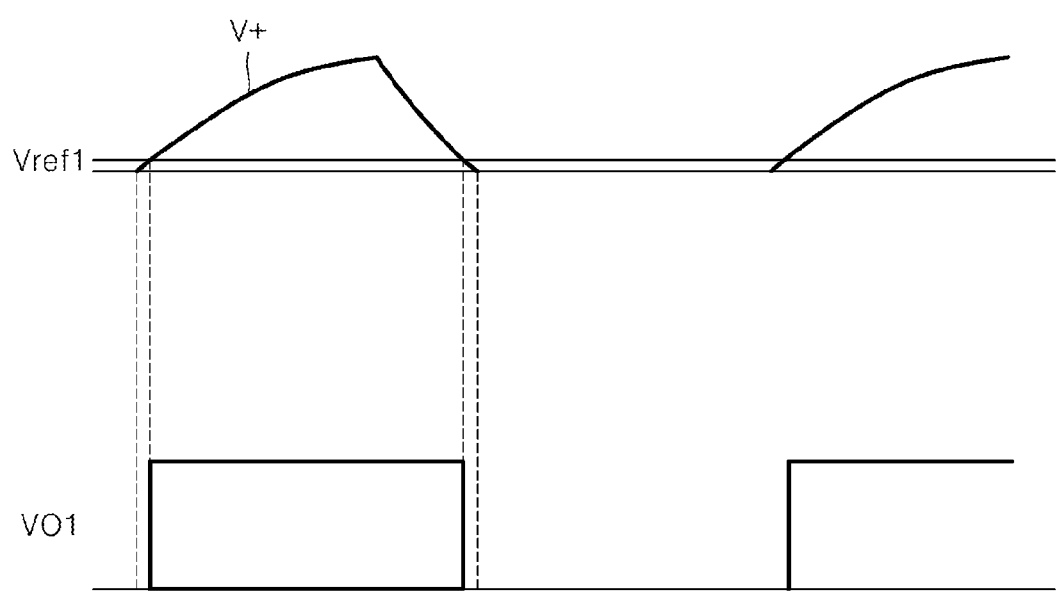

FIG. 21 is a circuit diagram showing another example of the phase detector 220 shown in FIG. 2. FIGS. 22 and 23 respectively show examples of input and output of the first comparator shown in FIG. 21.

In some examples, a phase detector 230 shown in FIG. 21 may correspond to the phase detector 220 in FIG. 2, and may be only different from an example of the phase detector 220 shown in FIG. 10 with respect to types of the first comparator CP1 and the hysteresis circuit being electrically applied to the first comparator CP1. The phase detector 230 may be otherwise the same as an example of the phase detector 220 shown in FIG. 10 with respect to other configurations and features. Thus, the difference between the phase detector 230 with the phase detector 220 shown in FIG. 10 is mainly described.

In some implementations, referring to FIGS. 21 to 23, in contrast to the example of the phase detector 220 shown in FIG. 10, the phase detector 230 shown in FIG. 21 may include an open drain type first comparator CP1 and may not include the hysteresis circuit.

For example, the first comparator CP1 (see FIG. 21), used in the phase detector 230 shown in FIG. 21, may be an open drain type comparator and have a low reaction speed (i.e., a driving speed) than a low reaction speed (i.e., a driving speed) of the CMOS type comparator CP1 (see FIG. 10), and may not generate floating.

In some examples, the output terminal of an open drain type comparator is not connected to a circuit inside the comparator (i.e., also not connected to a driving voltage source of the comparator), and output voltage is generated through a circuit (including voltage source and resistance) provided outside the comparator. In some examples, only certain magnitude of voltage (in the high state) or 0 V (in the low state) exists in the output voltage of the open drain type comparator and no floating occurs.

In some examples, the CMOS type comparator may have a faster reaction speed than a reaction speed of the open drain type comparator and the output terminal of the CMOS type comparator is connected to the driving voltage source of the comparator through an internal circuit to thereby output abnormal voltage (i.e., to occur the floating) other than the voltage in the high state or the low state during abnormal operation of the internal circuit.

That is, the first comparator CP1 included in the phase detector 230 shown in FIG. 21 corresponds to an open drain type comparator in which no floating phenomenon occurs, and thus, no hysteresis circuit is desired. In the phase detector 230 shown in FIG. 21, the hysteresis circuit is not used for the first comparator CP1.

In some examples, in the phase detector 230 shown in FIG. 21, as the hysteresis circuit is not electrically connected to the first comparator CP1, the material cost desired for providing the hysteresis circuit may be reduced compared to an example of the phase detector 220 shown in FIG. 10.

In some examples, each of the second comparator CP2 and the third comparator CP3 may include a CMOS type comparator and may also include an open drain type comparator. A first portion of the second comparator CP2 and the third comparator CP3 may include the CMOS type comparator, and a second portion of the second comparator CP2 and the third comparator CP3 may include an open drain type comparator.

In some implementations, the phase detector 230 shown in FIG. 21 may include both the second comparator CP2 and the third comparator CP3 that are CMOS type comparators.

In some examples, the phase detector 230 shown in FIG. 21 may include the open drain type first comparator CP1. As shown in FIGS. 22 and 23, based on the magnitude of the resonance voltage V+ applied to the positive input terminal of the first comparator CP1 (e.g., the (+) input terminal of the first comparator CP1 in FIG. 21) being equal to or greater than the magnitude of the voltage applied to the negative input terminal (e.g., the (−) input terminal of the first comparator CP1 in FIG. 21), the first comparator CP1 may determine the value of the first voltage VO1 in the high state.

In some examples, based on the magnitude of the resonance voltage V+ applied to the positive input terminal of the first comparator CP1 (e.g., the (+) input terminal of the first comparator CP1 in FIG. 21) being less than the voltage applied to the negative input terminal (e.g., the (−) input terminal of the first comparator CP1 in FIG. 21) (for reference, V− is the same as the first reference voltage Vref1 in FIGS. 21 and 23), the first comparator CP1 may determine the value of the first voltage VO1 to be in the low state.

In some examples, the first reference voltage Vref1 may be set on the same principle as shown in FIG. 10.

In some implementations, the phase detector 220 of the induction heating device 1 may be variously implemented as shown in FIGS. 10 and 21. In some examples, the phase detector 220 is not limited to the example shown in FIGS. 10 and 21, and may be provided in other forms.

In some implementations, the induction heating device 1 may improve the output control function and help to prevent the generation of the discharge loss of the snubber capacitor to thereby avoid the heat generation and the damage caused by the hard switching of the inverter in advance. In some examples, it may be possible to drive the product in a safe area through minimal heat generation and damage to thereby improve product performance and reliability thereof.

While the present disclosure has been described with reference to exemplary drawings thereof, it is to be understood that the present disclosure is not limited to implementations and drawings in the present disclosure, and various changes can be made by the skilled person in the art within the scope of the technical idea of the present disclosure. Although working effects obtained based on configurations of the present disclosure are not explicitly described while describing the implementations of the present disclosure, effects predictable based on the configurations have also to be recognized.

What is claimed is:

1. An induction heating device, comprising:
   a working coil;
   an inverter comprising a first switching element and a second switching element that are configured to perform a switching operation and to apply a resonance current to the working coil based on the switching operation;
   a snubber capacitor comprising a first snubber capacitor electrically connected to the first switching element, and a second snubber capacitor electrically connected to the second switching element;
   a phase detector electrically connected between the inverter and the working coil, the phase detector comprising a circuit configured to detect a phase difference between the resonance current applied to the working coil and a switching voltage applied to the second switching element; and
   a controller configured to:
     receive, from the phase detector, phase information including the phase difference,
     provide the inverter with a switching signal to thereby control the switching operation, and
     adjust an operating frequency of the switching signal based on the phase information to thereby control an output of the working coil,
   wherein the first snubber capacitor is configured to, based on the phase difference being greater than or equal to a preset phase value, be completely discharged before the first switching element is turned on after the second switching element has been turned off.

2. An induction heating device, comprising:
   a working coil;
   an inverter comprising a first switching element and a second switching element that are configured to perform a switching operation and to apply a resonance current to the working coil based on the switching operation;
   a snubber capacitor comprising a first snubber capacitor electrically connected to the first switching element, and a second snubber capacitor electrically connected to the second switching element;
   a phase detector electrically connected between the inverter and the working coil, the phase detector comprising a circuit configured to detect a phase difference between the resonance current applied to the working coil and a switching voltage applied to the second switching element; and
   a controller configured to:
     receive, from the phase detector, phase information including the phase difference,
     provide the inverter with a switching signal to thereby control the switching operation,
     adjust an operating frequency of the switching signal based on the phase information to thereby control an output of the working coil,
     detect a magnitude of the resonance current and a magnitude of the switching voltage through the phase detector, and
     determine the output of the working coil based on the magnitude of the resonance current, the magnitude of the switching voltage, and the phase information.

3. The induction heating device of claim 2, further comprising an input interface configured to receive touch input from a user and transmit the touch input to the controller, wherein the controller is configured to:
   based on the touch input indicating an output command value for the working coil, determine an output value of the working coil;
   compare the output command value with the output value of the working coil; and
   adjust the operating frequency of the switching signal based the comparison of the output command value with the output value of the working coil.

4. The induction heating device of claim 3, wherein the controller is configured to, based on the output command value being equal to the output value of the working coil, maintain the operating frequency of the switching signal.

5. The induction heating device of claim 3, wherein the controller is configured to, based on the output command value being greater than the output value of the working coil, compare the phase difference with a preset phase value and adjust the operating frequency of the switching signal based on the comparison of the phase difference with the preset phase value.

6. The induction heating device of claim 5, wherein the controller is configured to:
   based on the phase difference being greater than or equal to the preset phase value, decrease the operating frequency of the switching signal; and
   based on the phase difference being less than the preset phase value, increase the operating frequency of the switching signal.

7. The induction heating device of claim 5, wherein the first snubber capacitor is configured to, based on the phase difference being greater than or equal to the preset phase value, be completely discharged before the first switching element is turned on after the second switching element has been turned off.

8. The induction heating device of claim 3, wherein the controller is configured to, based on the output command value being less than the output value of the working coil, increase the operating frequency of the switching signal.

9. An induction heating device, comprising:
a working coil;
an inverter comprising a first switching element and a second switching element that are configured to perform a switching operation and to apply a resonance current to the working coil based on the switching operation;
a snubber capacitor comprising a first snubber capacitor electrically connected to the first switching element, and a second snubber capacitor electrically connected to the second switching element;
a phase detector electrically connected between the inverter and the working coil, the phase detector comprising a circuit configured to detect a phase difference between the resonance current applied to the working coil and a switching voltage applied to the second switching element; and
a controller configured to:
receive, from the phase detector, phase information including the phase difference,
provide the inverter with a switching signal to thereby control the switching operation, and
adjust an operating frequency of the switching signal based on the phase information to thereby control an output of the working coil,
wherein the phase detector comprises:
a current transformer comprising a first coil connected to the inverter and the working coil, the current transformer being configured to change a magnitude of a first resonance current in the first coil,
a current detecting circuit electrically connected to the current transformer, the current detecting circuit being configured to receive the first resonance current and to output a first voltage based on the first resonance current,
a voltage detecting circuit electrically connected to the inverter, the voltage detecting circuit being configured to receive the switching voltage applied to the second switching element and to output a second voltage based on the switching voltage, and
an output circuit configured to receive the first voltage and the second voltage and to output a pulse based on the first voltage and second voltage.

10. The induction heating device of claim 9, wherein the controller is configured to receive the pulse from the output circuit, and
wherein a pulse width of the pulse provided by the output circuit corresponds to the phase information.

11. The induction heating device of claim 9, wherein the current detecting circuit comprises:
a first current detecting resistor electrically connected to a second coil of the current transformer;
a diode electrically connected to the first current detecting resistor;
a second current detecting resistor electrically connected to the diode in series;
a third current detecting resistor having a first end electrically connected to the second current detecting resistor and a second end connected to a ground; and
a first comparator connected to a first node between the second current detecting resistor and the third current detecting resistor, the first comparator being configured to output the first voltage.

12. The induction heating device of claim 11, wherein the current detecting circuit further comprises a hysteresis circuit electrically connected between the first node and an output terminal of the first comparator,
wherein the hysteresis circuit comprises:
a first hysteresis resistor electrically connected between the first node and a positive input terminal of the first comparator; and
a second hysteresis resistor having a first end electrically connected to the first hysteresis resistor and the positive input terminal, and a second end electrically connected to the output terminal of the first comparator.

13. The induction heating device of claim 11, wherein the controller is electrically connected to the first node and configured to detect a magnitude of a voltage applied to the first node and to determine a magnitude of the resonance current applied to the working coil based on the magnitude of the voltage applied to the first node.

14. The induction heating device of claim 11, wherein the voltage detecting circuit comprises:
a first voltage sensing resistor electrically connected to the second switching element;
a second voltage sensing resistor having a first end electrically connected to the first voltage sensing resistor and a second end electrically connected to the ground; and
a second comparator connected to a second node between the first voltage sensing resistor and the second voltage sensing resistor, the second comparator being configured to output the second voltage.

15. The induction heating device of claim 14, wherein the controller is electrically connected to the second node and configured to detect a magnitude of a voltage applied to the second node and to determine a magnitude of the switching voltage applied to the second switching element based on the magnitude of the voltage applied to the second node.

16. The induction heating device of claim 14, wherein the output circuit comprises:
a first pulse generation resistor electrically connected to an output terminal of the current detecting circuit;
a second pulse generation resistor electrically connected to an output terminal of the voltage detecting circuit;
a third pulse generation resistor electrically connected to the second pulse generation resistor and the ground, a third node being disposed between the second pulse generation resistor and the third pulse generation resistor; and
a third comparator electrically connected to a fourth node disposed between the third node and the first pulse generation resistor, the third comparator being configured to output the pulse.

17. The induction heating device of claim 16, wherein each of the first comparator, the second comparator, and the third comparator comprises a complementary metal-oxide semiconductor (CMOS).

18. The induction heating device of claim 16, wherein the first comparator comprises a first reference terminal electrically connected to the ground, wherein the second comparator comprises a second reference terminal electrically connected between the second end of the second voltage sensing resistor and the ground, and wherein the third comparator has a third reference terminal electrically connected to the ground.

19. The induction heating device of claim 16, wherein the first comparator comprises a first output terminal corresponding to the output terminal of the current detecting circuit, wherein the second comparator comprises a second output terminal corresponding to the output terminal of the voltage detecting circuit, and wherein the third comparator comprises a third output terminal electrically connected to the controller.

20. The induction heating device of claim 19, wherein the first output terminal is connected to a positive input terminal of the first comparator that is connected to the first node.

\* \* \* \* \*